United States Patent
Kim et al.

(10) Patent No.: US 10,741,905 B2
(45) Date of Patent: Aug. 11, 2020

(54) ELECTRONIC DEVICE INCLUDING MULTIPLE COILS

(71) Applicant: SAMSUNG ELECTRONICS CO., LTD., Suwon-si, Gyeonggi-do (KR)

(72) Inventors: Youn-Ju Kim, Suwon-si (KR); Jae-Woong Jeon, Suwon-si (KR); Kyeong-Jo Keum, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/950,450

(22) Filed: Apr. 11, 2018

(65) Prior Publication Data

US 2018/0301790 A1 Oct. 18, 2018

(30) Foreign Application Priority Data

Apr. 17, 2017 (KR) .......................... 10-2017-0049419

(51) Int. Cl.
*H01Q 1/24* (2006.01)
*H02J 7/02* (2016.01)
(Continued)

(52) U.S. Cl.
CPC ......... *H01Q 1/243* (2013.01); *H01F 27/2804* (2013.01); *H01F 38/14* (2013.01);
(Continued)

(58) Field of Classification Search
CPC . H01Q 1/243; H01Q 7/00; H02J 50/12; H02J 7/025; H02J 7/0042; H02J 50/10;
(Continued)

(56) References Cited

U.S. PATENT DOCUMENTS 9,184,799 B2 * 11/2015 Jang .................... H04B 5/0025
10,050,478 B2 * 8/2018 Kim ..................... H02J 7/0042
(Continued)

FOREIGN PATENT DOCUMENTS

| EP | 3 048 666 | 7/2016 |
| WO | 2016/186443 | 11/2016 |
| WO | 2017/014430 | 1/2017 |

OTHER PUBLICATIONS

Extended Search Report dated Sep. 3, 2018 in counterpart European Patent Application No. 18167789.9.

*Primary Examiner* — Dameon E Levi
*Assistant Examiner* — Ab Salam Alkassim, Jr.
(74) *Attorney, Agent, or Firm* — Nixon & Vanderhye P.C.

(57) ABSTRACT

Disclosed are various embodiments related to an electronic device including a coil. The electronic device may include: a housing including a first face facing a first direction and a second face facing a second direction different from the first direction; and a flexible printed circuit board and a control circuit disposed between the first and second faces. The flexible printed circuit board may include a first coil including at least one turn, a second coil including at least one turn, and a third coil including at least one turn. At least a part of the second coil may surround a first portion of the first coil, a second portion of the first coil may surround at least a part of the second coil, a third portion of the first coil may surround the second portion of the first coil, and at least a part of the third coil may be disposed between at least a part of the second portion of the first coil and at least a part of the third portion of the first coil. The control circuit may be configured to: transmit a signal outward by a first transmission method using the first coil; transmit a signal outward by
(Continued)

a second transmission method using the second coil; and transmit a signal outward by a third transmission method using the third coil.

11 Claims, 20 Drawing Sheets

(51) Int. Cl.
| | |
|---|---|
| H01Q 7/00 | (2006.01) |
| H02J 50/12 | (2016.01) |
| H05K 1/16 | (2006.01) |
| H04B 5/00 | (2006.01) |
| H05K 1/11 | (2006.01) |
| H01F 27/28 | (2006.01) |
| H02J 50/70 | (2016.01) |
| H01F 38/14 | (2006.01) |
| H02J 7/00 | (2006.01) |
| H05K 1/02 | (2006.01) |
| H04B 15/00 | (2006.01) |
| H02J 50/10 | (2016.01) |

(52) U.S. Cl.
CPC ............ *H01Q 7/00* (2013.01); *H02J 7/0042* (2013.01); *H02J 7/025* (2013.01); *H02J 50/12* (2016.02); *H02J 50/70* (2016.02); *H04B 5/005* (2013.01); *H04B 5/0031* (2013.01); *H04B 5/0037* (2013.01); *H04B 5/0081* (2013.01); *H04B 5/0087* (2013.01); *H04B 15/00* (2013.01); *H05K 1/028* (2013.01); *H05K 1/118* (2013.01); *H05K 1/165* (2013.01); *H02J 50/10* (2016.02); *H05K 2201/10098* (2013.01)

(58) Field of Classification Search
CPC ... H02J 50/20; H02J 50/70; H01F 2027/2809; H01F 38/14; H01F 38/2804; H04B 5/0031; H04B 5/0037; H04B 5/0081; H04B 5/0087; H04B 5/005; H04B 15/00; H05K 1/028; H05K 1/118; H05K 1/165; H05K 2201/10098

See application file for complete search history.

(56) References Cited

U.S. PATENT DOCUMENTS

| | | | |
|---|---|---|---|
| 2005/0212707 A1* | 9/2005 | Egbert | G06K 19/07749 343/702 |
| 2012/0086556 A1* | 4/2012 | Ikemoto | G06K 19/07749 340/10.1 |
| 2012/0262357 A1* | 10/2012 | Kato | H01Q 1/38 343/788 |
| 2013/0181875 A1* | 7/2013 | Charrat | H01Q 7/005 343/748 |
| 2014/0168019 A1* | 6/2014 | Hirobe | H01Q 1/243 343/720 |
| 2014/0210406 A1 | 7/2014 | Na et al. | |
| 2015/0130979 A1* | 5/2015 | Huang | H01F 38/14 348/333.01 |
| 2016/0204836 A1* | 7/2016 | Lee | H04B 5/0087 343/702 |
| 2016/0210615 A1* | 7/2016 | Lee | G06Q 20/3278 |
| 2016/0210616 A1* | 7/2016 | Lee | G06Q 20/3278 |
| 2017/0004921 A1* | 1/2017 | Kim | H02J 50/10 |
| 2017/0047636 A1* | 2/2017 | Lee | H01Q 5/321 |
| 2017/0047791 A1* | 2/2017 | Jang | H02J 50/90 |
| 2017/0054213 A1* | 2/2017 | Singh | H01Q 7/06 |
| 2017/0077754 A1* | 3/2017 | Jeong | H02J 50/12 |
| 2017/0108969 A1* | 4/2017 | Lim | G06F 3/046 |
| 2017/0229900 A1* | 8/2017 | Cho | H02J 50/70 |
| 2018/0040950 A1* | 2/2018 | Lee | H01Q 1/526 |
| 2018/0132376 A1* | 5/2018 | Shin | H01F 27/36 |
| 2018/0138746 A1 | 5/2018 | Jang | |
| 2018/0159598 A1* | 6/2018 | Ahn | H01F 27/006 |
| 2018/0189627 A1* | 7/2018 | Kwon | G06K 19/07779 |
| 2018/0198310 A1* | 7/2018 | Hwang | H05K 9/00 |
| 2018/0212475 A1* | 7/2018 | Noh | H01F 38/14 |
| 2018/0217006 A1* | 8/2018 | Choi | G01K 7/223 |
| 2018/0287258 A1* | 10/2018 | Kim | H01Q 7/06 |
| 2019/0012585 A1* | 1/2019 | Cho | G06K 19/06196 |
| 2019/0044391 A1* | 2/2019 | Jang | H04B 5/0081 |
| 2019/0097278 A1* | 3/2019 | Park | H01M 10/48 |
| 2019/0109373 A1* | 4/2019 | Ahn | H01Q 1/38 |
| 2019/0363565 A1* | 11/2019 | Graham | H01F 38/14 |
| 2019/0393604 A1* | 12/2019 | Ichikawa | H01F 38/14 |

* cited by examiner

ELECTRONIC DEVICE INCLUDING MULTIPLE COILS

CROSS-REFERENCE TO RELATED APPLICATION

This application is based on and claims priority under 35 U.S.C. § 119 to Korean Patent Application Serial No. 10-2017-0049419, which was filed in the Korean Intellectual Property Office on Apr. 17, 2017, the disclosure of which is incorporated by reference herein in its entirety.

TECHNICAL FIELD

The present disclosure relates to an electronic device including multiple coils for data transmission and reception with an external electronic device.

BACKGROUND

Due to the development of electronic technologies, various types of electronic devices have been developed and distributed. For example, the distribution of portable electronic devices such as smart phones, notebook PCs, tablet PCs, and wearable devices is being expanded.

Electronic devices, which have recently come into the market, support a number of wireless communication technologies in order to provide various services to users. Wireless communication technologies use different frequency bands depending on the types thereof. Thus, electronic devices include an antenna or multiple coils for supporting multiple wireless communication technologies.

Electronic devices, which support near field wireless communication technologies such as Near Field Communication (NFC), Magnetic Secure Transmission (MST), or wireless charging may include multiple coils for performing these short-range wireless communication operations. For example, an NFC coil capable of communicating radio signals in an NFC band (e.g., 13.56 MHz) is used for NFC communication. The NFC coil may be divided into a small tag region and a large tag region. A coil for wireless communication in an MST band may be used for MST communication. A separate wireless charging coil may also be used for wireless charging. However, when the multiple coils are arranged together in a small electronic device, the performance of the electronic device may deteriorate due to interference between the coils.

SUMMARY

According to various example embodiments disclosed herein, a method and an electronic device in which multiple coils are configured to conduct short-range wireless communication, so that that interference between the multiple coils can be reduced and performance degradation can be suppressed are provided.

According to various example embodiments, an electronic device may include: a housing including a first face facing a first direction and a second face facing a second direction different from the first direction; and a flexible printed circuit board and a control circuit disposed between the first and second faces. The flexible printed circuit board may include a first coil including at least one turn, a second coil including at least one turn, and a third coil including at least one turn. At least a part of the second coil may surround a first portion of the first coil, a second portion of the first coil may surround at least a part of the second coil, a third portion of the first coil may surround the second portion of the first coil, and at least a part of the third coil may be disposed between at least a part of the second portion of the first coil and at least a part of the third portion of the first coil. The control circuit may be configured to: transmit a signal outward by a first transmission method using the first coil; transmit a signal outward by a second transmission method using the second coil; and transmit a signal outward by a third transmission method using the third coil.

According to various embodiments, a coil, which is included in an electronic device, may include: a board; a first coil including first, second, and third portions disposed on the board; a second coil disposed between the first and second portions of the first coil; and a third coil surrounding at least a part of the third portion of the first coil. The second portion of the first coil may be disposed between the third portion of the first coil and the second coil.

According to various embodiments, an electronic device may include: a housing including a first face facing a first direction and a second face facing a second direction different from the first direction; and a flexible printed circuit board and a control circuit disposed between the first and second faces. The flexible printed circuit board may include a first coil including at least one turn, and a second coil including at least one turn, at least a part of the second coil may surround a first portion of the first coil, a second portion of the first coil may surround at least a part of the second coil, and a third portion of the first coil may surround the second portion of the first coil. The control circuit may be configured to: transmit a signal outward by a first transmission method using the first coil; and transmit a signal outward by a second transmission method using the second coil.

According to various embodiments, the electronic device includes multiple coils for supporting multiple communication methods and a coil capable of preventing and/or reducing interference between the coils. Thus, it is possible to suppress deterioration in performance between the multiple communication methods.

According to various embodiments, in order to support multiple communication methods in an electronic device, multiple coils (e.g., an NFC coil, an MST coil, and a wireless charging coil) and an NFC coil for preventing and/or reducing interference are provided in an electronic device. Thus, it is possible to provide a shielding function between one coil (e.g., an NFC coil) and another coil (e.g., a wireless charging coil) adjacent thereto and to reduce an eddy current phenomenon. As a result, a recognition region can be enlarged, and the communication performance of the coils can be improved.

BRIEF DESCRIPTION OF THE DRAWINGS

The above and other aspects, features, and advantages of the present disclosure will be more apparent from the following detailed description, taken in conjunction with the accompanying drawings, in which like reference numerals refer to like elements, and wherein.

DETAILED DESCRIPTION

Figure 1:
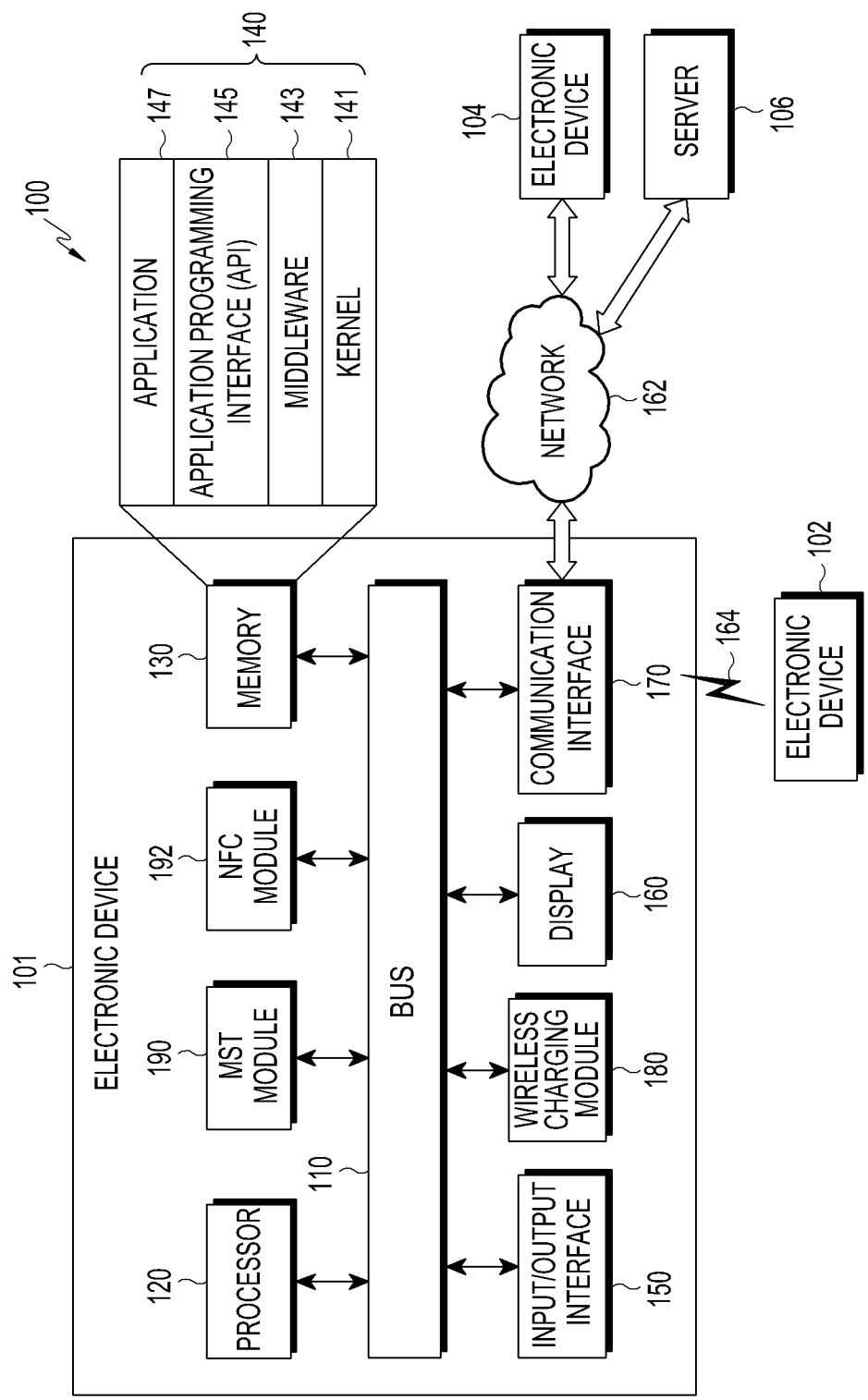
FIG. 1 is a block diagram illustrating a network environment that includes an electronic device according to various embodiments.

Hereinafter, various example embodiments will be described with reference to the accompanying drawings. The embodiments and the terms used therein are not intended to limit the technology disclosed herein to specific forms, and should be understood to include various modifications, equivalents, and/or alternatives to the corresponding embodiments.

In describing the drawings, similar reference numerals may be used to designate similar elements. A singular expression may include a plural expression unless they are definitely different in a context. As used herein, singular forms may include plural forms as well unless the context clearly indicates otherwise.

The expression "a first", "a second", "the first", or "the second" used in various embodiments may be used to refer to various components regardless of the order and/or the importance but does not limit the corresponding components. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in describing various embodiments may be interchangeably used with, for example, "suitable for", "having the capacity to", "designed to", "adapted to", "made to", or "capable of" in terms of hardware or software, according to circumstances. Alternatively, in some situations, the expression "device configured to" may refer to a situation in which the device, together with other devices or components, "is able to". For example, the phrase "processor adapted (or configured) to perform A, B, and C" may refer, for example, and without limitation, to a dedicated processor (e.g., embedded processor) for performing the corresponding operations or a generic-purpose processor (e.g., Central Processing Unit (CPU) or Application Processor (AP)) that can perform the corresponding operations by executing one or more software programs stored in a memory device, or the like.

An electronic device according to various embodiments may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device, or the like, but is not limited thereto.

According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit), or the like, but is not limited thereto. In some embodiments, the electronic device may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame, or the like, but is not limited thereto.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto. According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like), or the like, but is not limited thereto. In various embodiments, the electronic device may be flexible, or may be a combination of one or more of the aforementioned various devices. The electronic device according to an example embodiment is not limited to the above described devices. In the present disclosure, the term "user" may indicate a person using an electronic device or a device (e.g., an artificial intelligence electronic device) using an electronic device.

An electronic device 101 within the network environment 100, in various embodiments, will be described with reference to FIG. 1. The electronic device 101 may include a bus 110, a processor (e.g., including processing circuitry) 120, a memory 130, an input/output interface (e.g., including input/output circuitry) 150, a display 160, and a communication interface (e.g., including communication circuitry) 170. Additionally, the electronic device 101 may include a wireless charging module (e.g., including wireless charging circuitry) 180, an MST module (e.g., including MST circuitry) 190 and an NFC module (e.g., including NFC circuitry) 192, which will be described in greater detail below. In a certain embodiment, at least one of the above-mentioned components may be omitted from the electronic device 101 or the electronic device 10 may additionally include other components.

The bus 110 may include a circuit that interconnects the above-mentioned components 110 to 170, 190 and 192, and transfers communication information (e.g., a control message or data) between the components 110 to 170, 190 and 192.

The processor 120 may include various processing circuitry, such as, for example, and without limitation, one or more of a dedicated processor, a Central Processing Unit (CPU), an Application Processor (AP), and a Communication Processor (CP), or the like. The processor 120 may execute, for example, an arithmetic operation or data processing that is related to the control and/or communication of one or more other components of the electronic device 101.

The memory 130 may include a volatile memory and/or a non-volatile memory. The memory 130 may store, for example, commands or data that are related to one or more other components of the electronic device 101. According to an example embodiment, the memory 130 may store software or a program 140. The program 140 may include, for example, kernel 141, middleware 143, an Application Programming Interface (API) 145, or an application program ("application") 147. At least one of the kernel 141, the middleware 143, and the API 145 may be referred to as an Operating System (OS).

The kernel 141 may control or manage, for example, system resources (e.g., the bus 110, the processor 120, and the memory 130) that are used for executing operations or functions implemented in the other programs (e.g., the middleware 143, the API 145, or the application 147). In addition, the kernel 141 may provide an interface that allows the middleware 143, the API 145, or the application 147 to access individual components of the electronic device 101 so as to control or manage the system resources.

The middleware 143 may play an intermediary role such that, for example, the API 145 or the application 147 may communicate with the kernel 141 so as to exchange data. In addition, the middleware 143 may process one or more task requests which are received from the applications 147, according to priority. For example, the middleware 143 may assign the priority to be capable of using a system resource of the electronic device 101 (e.g., the bus 110, the processor 120, or the memory 130) to at least one of the applications 147, and may process the one or more task requests. The API 145 is, for example, an interface that allows the applications 147 to control functions provided from the kernel 141 or the middleware 143, and may include, for example, one or more interfaces or functions (e.g., commands) for a file control, a window control, an image processing, or a character control.

The input/output interface 150 may include various input/output circuitry and transmit commands or data, which are entered from, for example, a user or any other external device, to the other component(s) of the electronic device 101, or may output commands or data, which are received from the other component(s) of the electronic device 101, to the user or the other external device.

The display device 160 may include, for example, a Liquid Crystal Display (LCD), a Light Emitting Diode (LED) display, an Organic Light Emitting Diode (OLED) display, a MicroElectroMechanical System (MEMS), or an electronic paper display, or the like, but is not limited thereto. The display 160 may display various contents (e.g., text, image, video, icon, or symbol) to, for example, the user. The display 160 may include a touch screen, and may receive a touch input, a gesture input, a proximity input, or a hovering input that is made using, for example, an electronic pen or a part of the user's body.

The communication interface 170 may include various communication circuitry and set, for example, communication between the electronic device 101 and an external device (e.g., a first external electronic device 102, a second external device 104, or a server 106). For example, the communication interface 170 may be connected with a network 162 through wired or wireless communication so as to communicate with the external device (e.g., the second external electronic device 104 or the server 106).

The wireless communication may include a cellular communication that uses at least one of, for example, Long-Term Evolution (LTE), LTE Advance (LTE-A), Code Division Multiple Access (CDMA), Wideband CDMA (WCDMA), Universal Mobile Telecommunication System (UMTS), Wireless Broadband (WiBro), and Global System for Mobile communication (GSM). According to an example embodiment, as illustrated as an element 164 in FIG. 1, the wireless communication may include at least one of, for example, Wireless Fidelity (Wi-Fi), Light Fidelity (Li-Fi), Bluetooth, Bluetooth Low Energy (BLE), ZigBee, Near Field Communication (NFC), Magnetic Secure Transmission (MST), Radio Frequency (RF), and Body Area Network (BAN). According to an example embodiment, the wireless communication may include GNSS. The GNSS may be, for example, a Global Positioning System (GPS), a Global navigation satellite system (Glonass), a Beidou navigation satellite system (hereinafter, "Beidou"), Galileo, or an European global satellite-based navigation system. Herein, "GPS" may be interchangeably used with "GNSS" below. The wired communication may include at least one of, for example, Universal Serial Bus (USB), High Definition Multimedia Interface (HDMI), Recommended Standard 232 (RS-232), power line communication, and Plain Old Telephone Service (POTS). The network 162 may include a telecommunication network (e.g., at least one of a computer network (e.g., LAN or WAN), the internet, and a telephone network).

Each of the first and second external electronic devices 102 and 104 may be the same type as or different from the electronic device 101. According to various embodiments, all or some of the operations to be executed by the electronic device 101 may be executed in another electronic device or multiple other electronic devices (e.g., the electronic devices 102 and 104 or the server 106). According to an example embodiment, in the case where the electronic device 101 should perform a certain function or service automatically or by a request, the electronic device 101 may request some functions or services that are associated therewith from the other electronic devices (e.g., the electronic devices 102 and 104 or the server 106), instead of, or in addition to, executing the functions or service by itself. The other electronic devices (e.g., the electronic devices 102 and 104 or the server 106) may execute the requested functions or additional functions, and may deliver the results to the electronic device 101. The electronic device 101 may provide the requested functions or services by processing the received results as they are or additionally. For this purpose, for example, a cloud computing technique, a distributed computing technique, or a client-server computing technique may be used.

The wireless charging module 180 may include various wireless charging circuitry and receive wireless power from a wireless power receiver or may transmit wireless power to another electronic device. The wireless charging module 180 may receive or transmit wireless power based on an inductive or resonant manner. The wireless charging module 180 may include a coil for transmitting/receiving wireless power.

The MST module 190 may include various MST circuitry and be provided as an independent module separately from, for example, the communication interface 170. The MST module 190 can perform MST communication with other electronic devices. For example, the MST module 190 may emit electromagnetic fields, the magnitude of which varies over time, in order to transmit signals containing information. The information may include information for wireless settlement. The other electronic devices, e.g., a POS terminal, may receive signals containing information from the electronic device 101 by detecting a change over time in the magnitude of the electromagnetic field. On the other hand, the MST module 190 may include a coil for emission or detection of an electromagnetic field. The MST module 190 may receive signals from another electronic device by detecting a change over time in the electromagnetic field received from the other electronic device.

The NFC module 192 may include various NFC circuitry and be provided as an independent module separately from, for example, the communication interface 170. The NFC module 192 may operate in a reader (read/write) mode, a card (card emulation) mode, or a P2P (peer-to-peer) mode. According to an example embodiment, the NFC module 192 may change the operating mode under the control of the processor 120. The processor 120 may transmit/receive data to/from an external electronic device by controlling the NFC module 192. The NFC module 192 may include a coil for transmitting and receiving the data.

Figure 2:
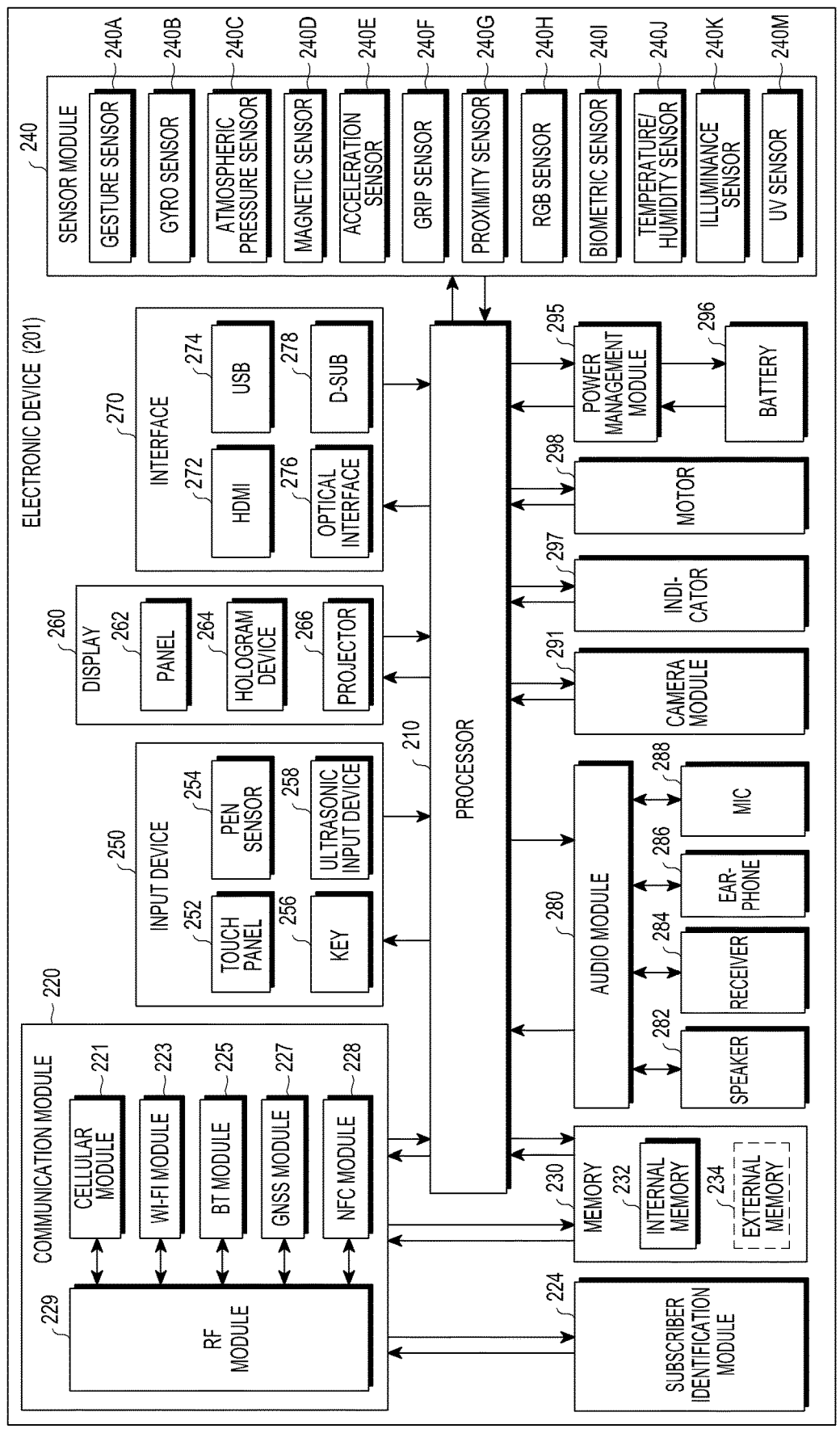
FIG. 2 is a block diagram illustrating an electronic device according to various embodiments.

FIG. 2 is a block diagram illustrating an electronic device 201 according to various example embodiments. The electronic device 201 may include, for example, the whole or a part of the electronic device 101 illustrated in FIG. 1.

The electronic device 201 may include at least one processor (e.g., an Application Processor (AP)) (e.g., including processing circuitry) 210, a communication module (e.g., including communication circuitry) 220, a subscriber identification module 224, a memory 230, a sensor module 240, an input device 250, a display 260, an interface 270, an audio module 280, a camera module 291, a power management module 295, a battery 296, an indicator 297, and a motor 298.

The processor 210 may include various processing circuitry and drive, for example, an operating system or an application program so as to control multiple hardware or software components connected thereto, and may also perform various data processing and arithmetic operations. The processor 210 may be implemented by, for example, a System-on-Chip (SoC). According to an example embodiment, the processor 210 may further include a Graphic Processing Unit (GPU) or an image signal processor. The processor 210 may include at least some components (e.g., a cellular module 221) among the components illustrated in FIG. 2. The processor 210 may load a command or data received from at least one of the other components (e.g., a non-volatile memory) in a volatile memory to process the command and data, and may store result data in a non-volatile memory.

The communication module 220 may have a configuration that is the same as or similar to the communication interface 170. The communication module 220 may include various modules each including various communication circuitry, such as, for example, and without limitation, a cellular module 221, a WiFi module 223, a Bluetooth module 225, a GNSS module 227, an NFC module 228, and a Radio Frequency (RF) module 229, or the like.

The cellular module 221 may provide, for example, a voice call, a video call, a message service, or an internet service through a communication network. According to an example embodiment, the cellular module 221 may perform discrimination and authentication of the electronic device 201 within the communication network by using the subscriber identification module (e.g., a SIM card) 224. According to an example embodiment, the cellular module 221 may perform at least some of the multimedia control functions that may be provided by the processor 210. According to an example embodiment, the cellular module 221 may include a Communication Processor (CP). According to a certain embodiment, at least some (e.g., two or more) of the cellular module 221, the WiFi module 223, the Bluetooth module 225, the GNSS module 227, and the NFC module 228 may be incorporated in a single Integrated Chip (IC) or an IC package. The RF module 229 may transmit/receive a communication signal (e.g., an RF signal). The RF module 229 may include, for example, a transceiver, a Power Amp Module (PAM), a frequency filter, a Low Noise Amplifier (LNA), or an antenna. According to another embodiment, at least one of the cellular module 221, the WiFi module 223, the Bluetooth module 225, the GNSS module 227, and the NFC module 228 may transmit/receive RF signals through a separate RF module.

The subscriber identification module 224 may include, for example, a card that includes a subscriber identification module or an embedded SIM, and may also include intrinsic identification information (e.g., Integrated Circuit Card IDentifier (ICCID)) or subscriber information (e.g., International Mobile Subscriber Identity (IMSI)).

The memory 230 (e.g., the memory 130) may include, for example, an internal memory 232 and/or an external memory 234. The internal memory 232 may include at least one of, for example, a volatile memory (e.g., a DRAM, an SRAM, or an SDRAM), a non-volatile memory (e.g., an One Time Programmable ROM (OTPROM), a PROM, an EPROM, an EEPROM, a mask ROM, a flash ROM, a flash memory, a hard drive, and a Solid-State Drive (SSD). The external memory 234 may further include a flash drive (e.g., a Compact Flash (CF), a Secure Digital (SD), a Micro Secure Digital (Micro-SD), a Mini Secure Digital (Mini-SD), an extreme Digital (xD), a Multi-Media Card (MMC), or a memory stick). The external memory 234 may be functionally or physically connected to the electronic device 201 through various interfaces.

For example, the sensor module 240 may measure a physical quantity or may sense an operating status of the electronic device 201, and may then convert the measured or sensed information into electrical signals. The sensor module 240 may include at least one of, for example, a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., RGB (Red, Green, Blue) sensor), a biometric sensor 240I, a temperature/humidity sensor 240J, an illuminance sensor 240K, and an Ultra-Violet (UV) sensor 240M. Additionally, or alternatively, the sensor module 240 may include, for example, an E-nose sensor, an ElectroMyoGraphy (EMG) sensor, an ElectroEncephaloGram (EEG) sensor, an ElectroCardioGram (ECG) sensor, an Infra-Red (IR) sensor, an iris sensor, or a fingerprint sensor. The sensor module 240 may further include a control circuit for controlling one or more sensors incorporated therein. In a certain embodiment, the electronic device 201 may further include a processor configured to control the sensor module 240 as a part of the processor 210 or separate from the processor 210 so as to control the sensor module 240 while the processor 210 is in the sleep state.

The input device 250 may include various input circuitry, such as, for example, and without limitation, a touch panel 252, a (digital) pen sensor 254, a key 256, or an ultrasonic input device 258, or the like. As the touch panel 252, at least one of, for example, a capacitive type touch panel, a resistive type touch panel, an infrared type touch panel, and an ultrasonic type panel may be used. Also, the touch panel 252 may further include a control circuit. The touch panel 252 may further include a tactile layer so as to provide a tactile reaction to the user.

The (digital) pen sensor 254 may be, for example, a part of the touch panel, or may include a separate recognition sheet. The key 256 may include, for example, a physical button, an optical key, or a keypad. The ultrasonic input device 258 may sense, through a microphone (e.g., a microphone 288), ultrasonic waves generated by an input tool so as to confirm data corresponding to the sensed ultrasonic waves.

The display 260 (e.g., the display 160) may include a panel 262, a hologram device 264, a projector 266, or a control circuit for controlling these components. The panel 262 may be implemented to be, for example, flexible, transparent, or wearable. The panel 262 may be configured with the touch panel 252 and one or more modules. According to an example embodiment, the panel 262 may include a pressure sensor (or a force sensor) that is capable of measuring the intensity of a pressure for a user's touch. The pressure sensor may be integrally implemented with the touch panel 252, or implemented by one or more sensors separately from the touch panel 252. The hologram device 264 may show a stereoscopic image in the air using interference of light. The projector 266 may project light onto a screen so as to display an image. The screen may be located, for example, inside or outside the electronic device 201.

The interface 270 may include various interface circuitry, such as, for example, and without limitation, an HDMI 272, a USB 274, an optical interface 276, or a D-subminiature (D-sub) 278, or the like. For example, the interface 270 may be included in the communication interface 170 illustrated in FIG. 1. Additionally or alternatively, the interface 270 may include, for example, a Mobile High-definition Link (MHL) interface, an SD card/Multi-Media Card (MMC) interface, or an Infrared Data Association (IrDA) standard interface.

The audio module 280 may bi-directionally convert, for example, sound and electric signals. At least some of the components of the audio module 280 may be included in, for example, the input/output interface 145 illustrated in FIG. 1. The audio module 280 may process sound information input or output through, for example, a speaker 282, a receiver 284, an earphone 286, or a microphone 288. The camera module 291 is a device that is capable of capturing an image, for example, a still image and a video image, and according to an example embodiment, the camera module 291 may include at least one image sensor (e.g., a front sensor or a rear sensor), a lens, an Image Signal Processor (ISP), or a flash (e.g., LED or xenon lamp). The power management module 295 may manage, for example, the electric power of the electronic device 201. According to an example embodiment, the power management module 295 may include a Power Management Integrated Circuit (PMIC), a charger Integrated Circuit (IC), or a battery or fuel gauge. The PMIC may be configured as a wired or wireless charge type. The wireless charging type may include, for example, a magnetic resonance type, a magnetic induction type, or an electromagnetic wave type, and may further include an additional circuit for wireless charging (e.g., a coil loop, a resonance circuit, or a rectifier). The battery gauge may measure, for example, the residual capacity of the battery 296, and a voltage, a current, or a temperature during the charge. The battery 296 may include, for example, a rechargeable battery or a solar battery.

The indicator 297 may indicate a specific status (e.g., a booting status, a message status, or a charged status) of the electronic device 201 or of a part thereof (e.g., AP 210). The motor 298 may convert an electric signal into a mechanical vibration, and may generate, for example, a vibration or a haptic effect. The electronic device 201 may include, for example, a mobile TV support device (e.g., a GPU) that is capable of processing media data according to standards, such as Digital Multimedia Broadcasting (DMB), Digital Video Broadcasting (DVB), or MediaFlo™. Each of the components described herein may be constituted with one or more components, and the names of the corresponding components may vary depending on a type of an electronic device. In various embodiments, some components may be omitted from an electronic device (e.g., the electronic device 201) or the electronic device may further include additional components. Alternatively, some of the components may be combined into a single object such that the functions of the components before combination can be performed in the same manner.

Figure 3:
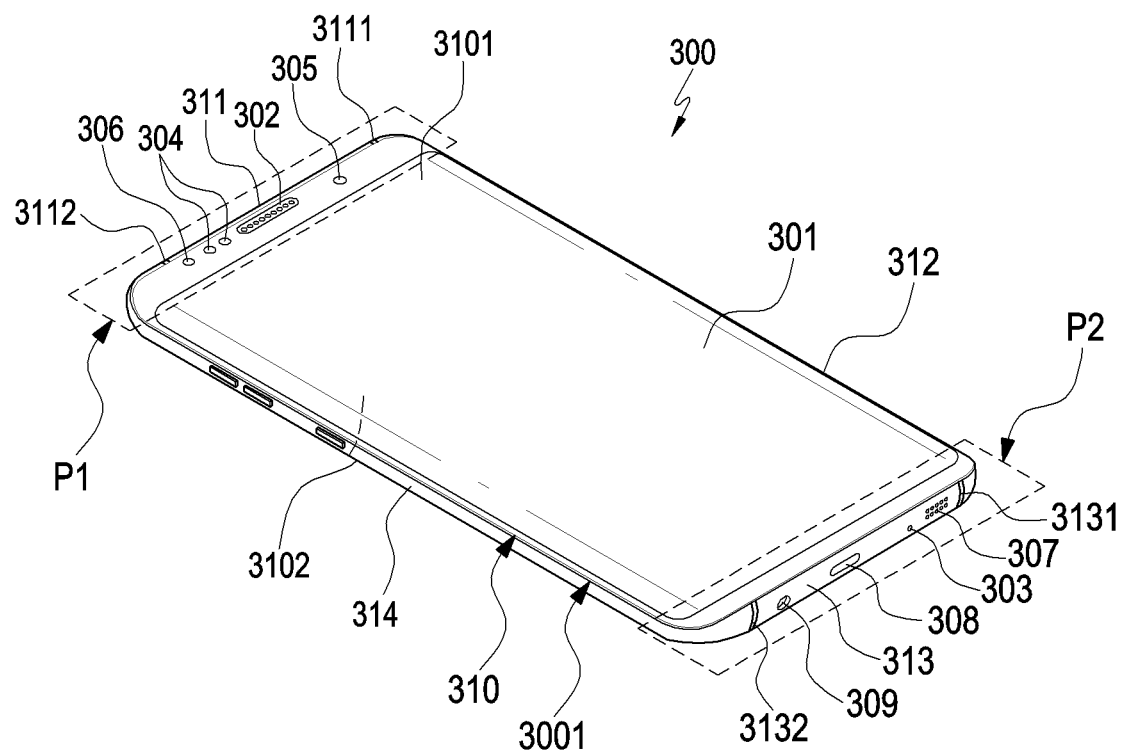
FIG. 3 is a perspective view illustrating the front face of an electronic device according to various embodiments.

FIG. 3 is a perspective view illustrating an electronic device according to various example embodiments.

Referring to FIG. 3, an electronic device 300 (e.g., the electronic device 101 in FIG. 1 or the electronic device 201 of FIG. 2) may include a housing 3001. According to an example embodiment, the housing 3001 may be formed of a conductive member and/or a non-conductive member. According to an example embodiment, the housing 3001 may include a first plate 3101, a second plate 3102 that is disposed to be spaced apart from and to face the first plate 3101, and a side member 310 that is disposed to surround a space between the first and second plates 3101 and 3102. According to an example embodiment, the side member 310 may be formed integrally with the second plate 3102. According to an example embodiment, the side member 310 may be disposed in the manner of being attached to the second plate 3102.

According to various embodiments, the electronic device 300 may include a touch screen display 301, which is disposed in the manner of being exposed to at least a partial region of the first plate. According to an example embodiment, the touch screen display 301 may include a pressure sensor so as to operate as a pressure-responsive touch screen display. According to an example embodiment, the electronic device 300 may include a receiver 302, which is disposed in the housing 3001 so as to output the voice of a communication partner. According to an example embodiment, the electronic device 300 may include a microphone device 303, which is disposed in the housing 3001 so as to transmit the user's voice to a communication partner.

According to various embodiments, the electronic device 300 may include various components, which are disposed in the manner of being exposed in the touch screen display 301, or in the manner of performing functions through the window but not being exposed, in order to perform various functions of the electronic device 300. According to an example embodiment, the components may include at least one sensor module 304. The sensor module 304 may include, for example, an illuminance sensor (e.g., an optical sensor), a proximity sensor (e.g., an optical sensor), an infrared sensor, an ultrasonic sensor, a fingerprint recognition sensor, or an iris recognition sensor. According to an example embodiment, the components may include a camera device 305. According to an example embodiment, the components may include an indicator 306 (e.g., an LED device) for visually providing status information of the electronic device to the user. According to an example embodiment, at least one of these components may be disposed to be exposed through at least a partial region of the second plate 3102.

According to various embodiments, the electronic device 300 may include a speaker device 307, which is disposed on one side of the microphone device 303. According to an example embodiment, the electronic device may include an interface connector port 308, which is disposed on the other side of the microphone device 303, in order to receive a data transmission/reception function by an external device and external power to charge the electronic device 300. According to an example embodiment, the electronic device 300 may include an ear jack assembly 309, which is disposed on one side of the interface connector port 308.

According to various embodiments, the touch screen display 301 may be disposed in such a manner that the substantially entire region of a first plate 3101 of the electronic device 300 and a partial region of the side member 310 or a partial region of a second plate 3102 including the side member 310 may be defined as a display region. In this case, the above-described electronic components (e.g., at least one of the speaker device, the microphone device, various sensor modules, and the camera device) may be disposed in the manner of performing the functions thereof within the electronic device through the display 301 (or a window) or in the manner of being exposed through the housing 310 other than the display region.

According to various embodiments, the side member 310 may include: a first side face 311 extending in a first direction (X-axis direction) and having a first length; a second side face 312 extending in a second direction (Y-axis direction) perpendicular to the first direction and having a second length longer than the first length; a third side face 313 extending in parallel to the first side face 311 and having the first length; and a fourth side face 314 extending in parallel to the second side face 312 and having the second length. According to an example embodiment, the first side face 311 may include a pair of non-conductive members 3111 and 3112, which are disposed between the second side 312 and the fourth side 314 to be spaced apart from each other by a predetermined distance. According to an example embodiment, the third side face may include a pair of non-conductive members 3131 and 3132 which are disposed between the second side face and the fourth side face to be spaced apart from each other by a predetermined interval. According to an example embodiment, at least one of the first to fourth side faces 311 to 314, which is segmented by the non-conductive members, may be utilized as an antenna radiator. According to an example embodiment, at least one antenna may be disposed in an upper region (e.g., a P1 region) or a lower region (e.g., a P2 region) where the touch screen display 301 is avoided within the electronic device 300. According to various embodiments, the electronic device 300 may include therein multiple coils (e.g., a flexible circuit board 500 illustrated in FIG. 5A) for sending out signals by multiple dispensing methods.

Figure 4:
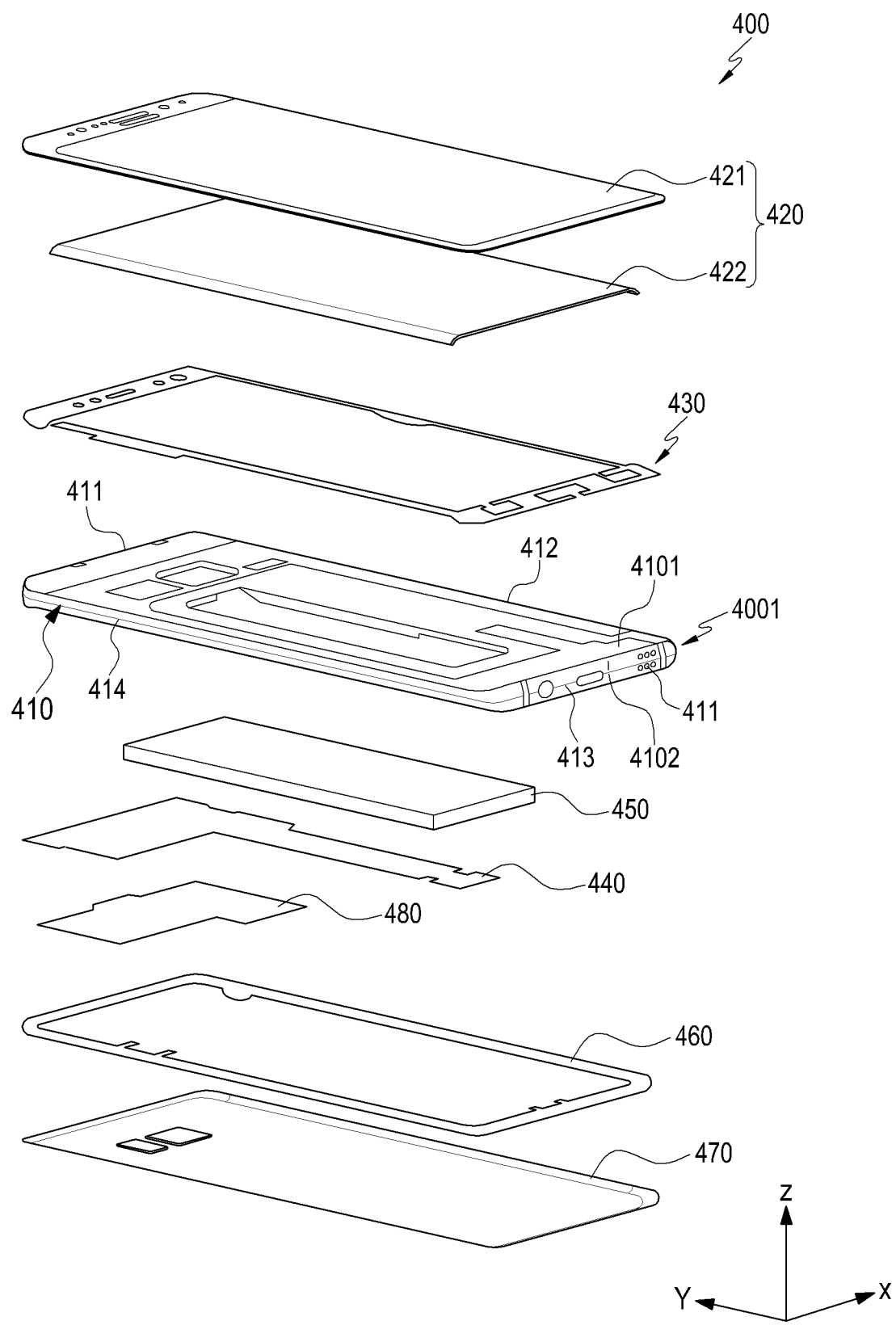
FIG. 4 is an exploded perspective view illustrating the electronic device according to various embodiments.

FIG. 4 is an exploded perspective view of an electronic device according to various example embodiments.

The electronic device 400 of FIG. 4 may be similar to the electronic device 300 of FIG. 3 or may include other embodiments of the electronic device.

Referring to FIG. 4, the electronic device 400 (e.g., the electronic device 101 of FIG. 1 or the electronic device 201 of FIG. 2) may include a support member housing 4001. The support member housing 4001 includes: a first plate 4101 (e.g., the first plate 3101 of FIG. 3); a second plate 4102 (e.g., the first plate 3102 in FIG. 3), which is disposed to face and to be spaced apart from the first plate 4101; and a side member 410, which is disposed in the manner of surrounding the edges of the first plate 4101 and the second plate 4102. According to an example embodiment, the side member 410 may include: a first side face 411 extending in a first direction (X-axis direction) and having a first length; a second side face 412 extending in a second direction (Y-axis direction) perpendicular to the first direction and having a second length longer than the first length; a third side face 413 extending in parallel to the first side face 411 and having the first length; and a fourth side face 414 extending in parallel to the second side face 412 and having the second length.

According to various embodiments, the electronic device 400 may include a touch screen display 420, which includes at least one first seal member 430 and a window 421 (e.g., a glass plate), which are sequentially disposed on the first plate 4101 of the housing 410, and a touch display module 422 attached to the rear face of the window 421.

According to an example embodiment, the electronic device 400 may include a PCB 440, a structure 480, a battery 450, a second seal member 460, and a rear surface window 470, which are disposed on the second plate 4102 of the housing 410. Although not illustrated, the electronic device 400 may further include a flexible printed circuit board including a wireless power coil, an NFC coil, an MST coil, or the like disposed between the support member 4001 and the rear window 470. According to an example embodiment, the electronic device 400 may further include a detection member for detecting an electronic pen applied as data input means. According to an example embodiment, the detection member may include an Electro-Magnetic Resonance (EMR) sensor pad that operates in an electromagnetic induction manner in order to receive a feedback signal by a resonance frequency of a coil provided in the electronic pen.

According to various embodiments, the battery 450 may be accommodated in an accommodation space formed in the housing 410 and may be disposed such that the battery avoids the PCB 440 or at least a partial region of the battery 450 may overlap the PCB 440. According to an example embodiment, the battery 450 and the PCB 440 may be disposed in parallel to each other without overlapping each other.

According to various embodiments, the touch screen display 420 may include a window 421 and a display module 422 disposed on the rear face of the window 421. According to an example embodiment, the touch display module 422 may include a pressure detection sensor.

According to various embodiments, the electronic device 400 may be configured as a waterproof structure in order to prevent and/or avoid water from penetrating into the internal space, which is formed by the housing 410, by a first seal member 430 and a second seal member 460. According to an example embodiment, the first seal member 430 and the second seal member 470 may include at least one of double-sided tape, adhesive, waterproof dispensing, silicon, waterproof rubber, and urethane.

Figure 5A:
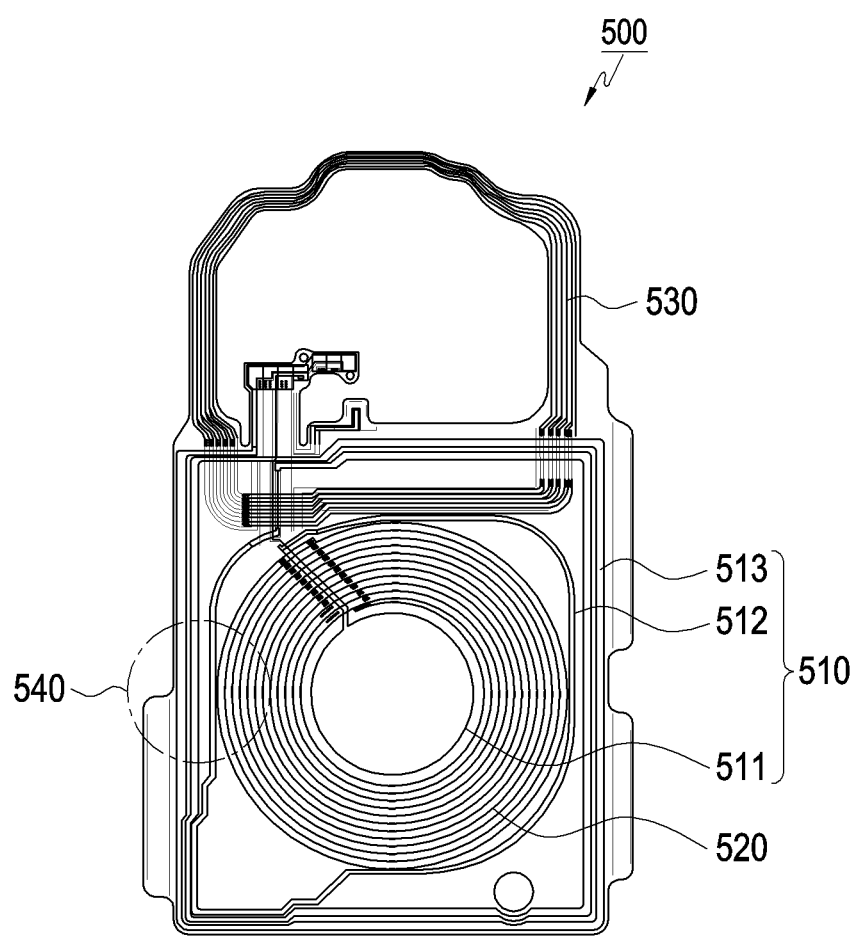
FIGS. 5A, 5B and 5C are diagrams each illustrating the structure of a flexible printed circuit board among the components of the electronic device according to various example embodiments.

FIG. 5A is a diagram illustrating a structure of a flexible printed circuit board 500 including multiple coils 510, 520, and 530, which may be provided in an electronic device 101 (e.g., the electronic device 101 of FIG. 1, the electronic device 201 of FIG. 2, the electronic device 300 of FIG. 3, or the electronic device 400 of FIG. 4) according to various example embodiments.

Referring to FIG. 5A, the flexible printed circuit board 500 may include, for example, a first coil 510 including at least one turn, a second coil 520 including at least one turn, and/or a third coil 530 including at least one turn. According to an example embodiment, the first coil 510 may include first, second, and third portions 511, 512, and 513. The first portion 511 may include at least one turn. The first portion 511 of the first coil 510 may be at least one turn in the form of a loop that is rotated a predetermined number of times in a predetermined direction. The second portion 512 may include at least one turn. The second portion 512 may be at least one turn in the form of a loop, which is disposed outside the first portion 511 and extends from the first portion 511 and is rotated a predetermined number of times in a predetermined direction. The third portion 513 may include at least one turn. The third portion 513 may be at least one turn in the form of a loop, which is disposed outside the second portion 512 and extends from the second portion 512 and is rotated a predetermined number of times in a predetermined direction. The first portion 511 of the first coil 510 may include the start point of the first coil 510, the third portion 513 of the first coil 510 may include the end point of the first coil 510.

According to an example embodiment, at least a part of the second coil 520 may surround the first portion 511 of the first coil 510. According to an example embodiment, the second portion 512 of the first coil 510 may surround at least a part of the second coil 520. According to an example embodiment, the third portion 513 of the first coil 510 may surround the second portion 512 of the first coil 510. According to an example embodiment, at least a part of the third coil 530 may be disposed between at least a part of the second portion 512 of the first coil 510 and at least a part of the third portion 513.

According to an example embodiment, the second portion 512 of the first coil 510 may be disposed between the third portion 513 of the first coil 510 and the second coil 520. The second coil 520 may be disposed between the first portion 511 and the second portion 512 of the first coil 510. The first portion 511 of the first coil 510 may be disposed inside the second coil 520.

According to an example embodiment, the first, second, and third portions 511, 512, and 513 of the first coil 510 may be NFC coils for NFC communication. As another example, the second coil 520 may be a wireless charging coil for wireless charging. As another example, the third coil 530 may be an MST coil for communication of a magnetic signal corresponding to a magnetic settlement card.

Figure 5B:
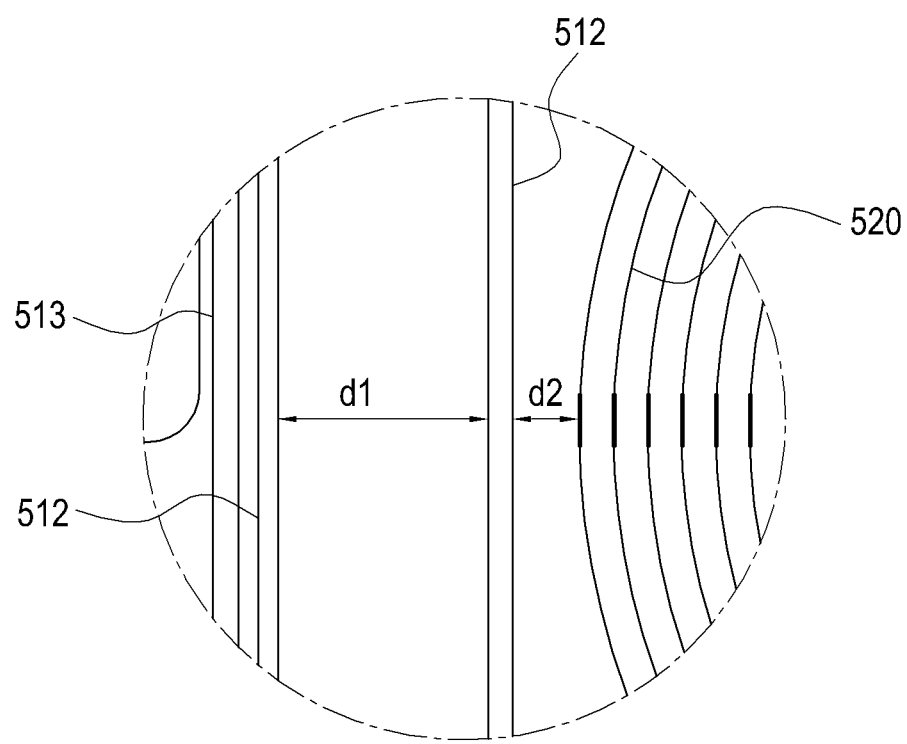

According to various embodiments, in the flexible printed circuit board 500, a first distance d1 of at least a part between the second portion 512 and the third portion 513 of the first coil 510 may include at least one region that is formed to be larger than a second distance d2 of at least a part between the second portion 512 and the second coil 520. FIG. 5B is an enlarged view of a section 540 of the flexible printed circuit board 500. Referring to FIG. 5B, for example, at a point of the second portion 512, the distance d1 between the second portion 512 and the third portion 513 is greater than the distance d2 between the second portion 512 and the second coil 520.

Figure 5C:
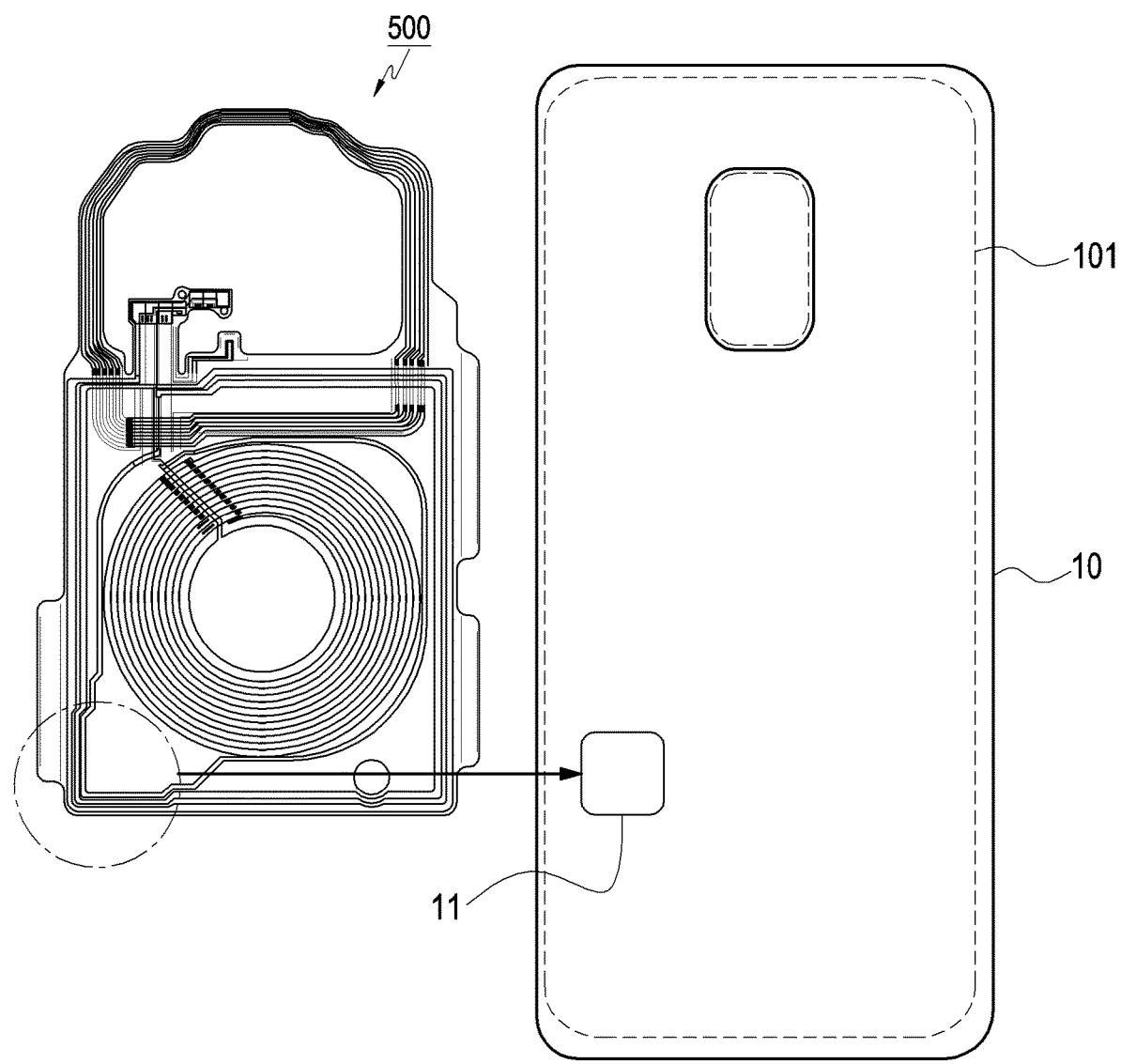

According to various embodiments, in the section 540 of the electronic device (e.g., the electronic device 101 of FIG. 1, the electronic device 201 of FIG. 2, the electronic device 300 of FIG. 3, or the electronic device 400 of FIG. 4), the first distance d1 between the second portion 512 and the third portion 513 of the first coil 510 may be formed to be less than the distance d2 between the second portion 512 and the second coil 520 due to a component provided inside or outside the electronic device (e.g., the electronic device 101 of FIG. 1, the electronic device 201 of FIG. 2, the electronic device 300 of FIG. 3, or the electronic device 400 of FIG. 4). For example, the first coil 510 may be an NFC coil and the component may be an NFC TAG IC for genuine product certification, which is provided in a removable protective cover (e.g., the electronic device 101 in FIG. 1, the electronic device 201 in FIG. 2, the electronic device 300 in FIG. 3, or the electronic device 400 in FIG. 4). In this case, in order to increase the power transmission density to the NFC TAG IC of the protective cover, the second portion 512 of the first coil 510 may be disposed closer to the third portion 513 than the second coil 520 in the section 540. FIG. 5C illustrates an example in which a protective cover 10 is coupled to the electronic device according to various embodiments. Referring to FIG. 5C, the section 540 may correspond to the position of the NFG TAG IC 11 included in the protective cover 10, for example.

According to various embodiments, the first portion 511 of the first coil 510 may be a coil for a small tag. The third portion 513 of the first coil 510 may be a coil for a large tag. According to various embodiments, the second portion 512 of the first coil 510 may be provided in order to prevent and/or reduce interference between the multiple coils. The second portion 512 of the first coil 510 may provide a shielding function between the second coils 520 adjacent to the first coil 510 and may reduce an eddy current phenomenon, which can prevent and/or reduce occurrence of a null region which is a region in which an electromagnetic field is attenuated due to the influence between the electrodes 510 and 520. Due to this, the interference between the coils 510 and 520 can be reduced, the recognition region of each of the coils 510 and 520 can be enlarged, and communication performance can be improved as well.

According to an example embodiment, the second portion 512 of the NFC coil 510 may be disposed between the wireless charging coil 520 and the MST coil 530. For example, the first portion 511 of the NFC coil 510, the third portion 513 of the NFC coil 510, and the wireless charging coil 520 may be disposed. The second portion 512 of the NFC coil 510 may be further disposed in a gap between the wireless charging coil 520 and the third portion 513 of the NFC coil 510. The second portion 512 may perform a shield function between coils so as to prevent and/or reduce deterioration caused by interference between the coils as well as to reduce an eddy current phenomenon between the NFC coil 510 and the wireless charging coil 520.

Figure 6A:
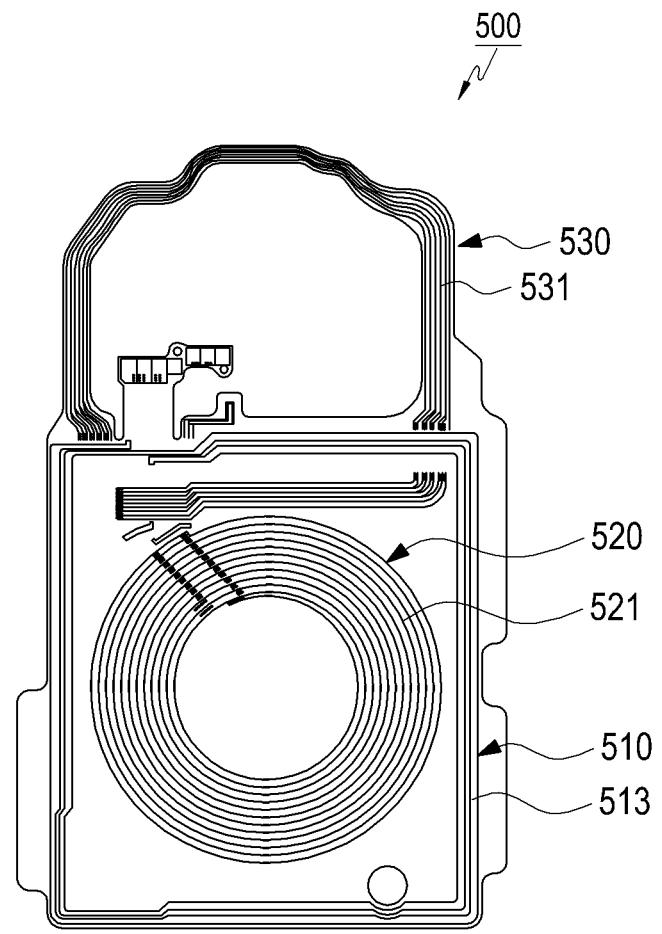
FIG. 6A is a diagram illustrating the structure of a first layer in the flexible printed circuit board among the components of the electronic device according to various example embodiments.

FIG. 6A is a diagram illustrating the structure of the first layer of the flexible printed circuit board 500 among the components of an electronic device (e.g., the electronic device 101 of FIG. 1, the electronic device 201 of FIG. 2, the electronic device 300 of FIG. 3, or the electronic device 400 of FIG. 4) according to various example embodiments.

According to various embodiments, the flexible printed circuit board 500 may include multiple layers. At least one of the multiple coils 510, 520, and 530 may be formed in any one of the multiple layers. As another example, at least one of the multiple coils 510, 520, and 530 may be formed by electrically connecting the conductive patterns formed in each of the multiple layers to each other via a via hole.

For example, FIG. 6A illustrates the structure of the first layer of the multiple layers of the flexible printed circuit board 500. Referring to FIG. 6A, for example, the first layer may include the third portion 513 of the first coil 510, the first portion 521 of the second coil 520, and the first portion 531 of the third coil 530.

In the first layer, the third portion 513 of the first coil 510 may surround the first portion 521 of the second coil 520. At least a part of the third portion 313 of the first coil 510 may surround at least a part of the first portion 531 of the third coil 530. The third portion 513 of the first coil 510 may include an end point of the first coil 510.

Figure 6B:
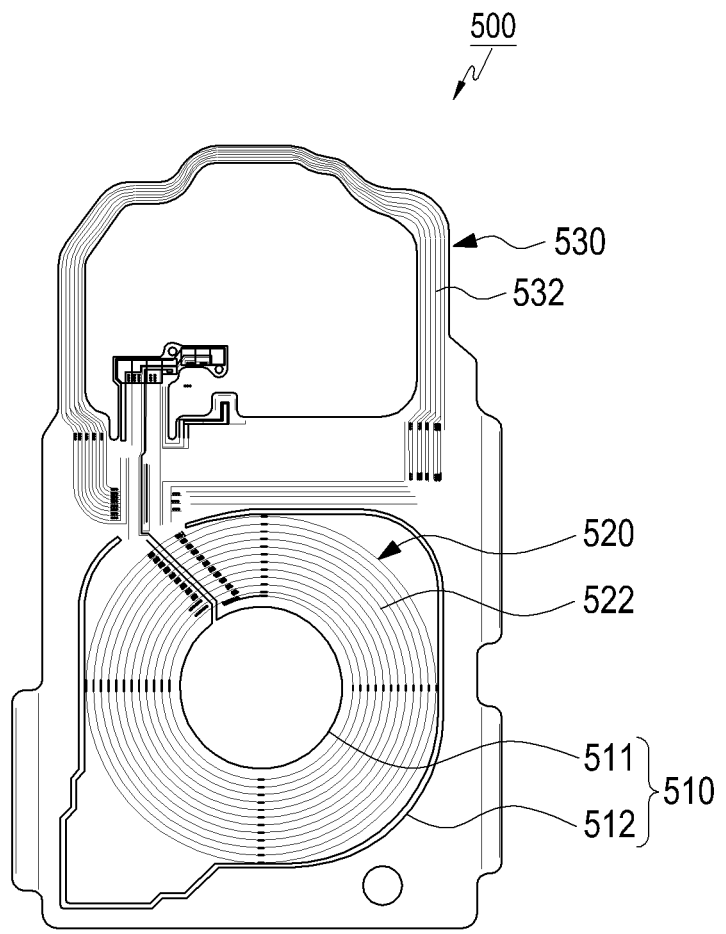
FIG. 6B is a diagram illustrating the structure of a second layer in the flexible printed circuit board among the components of the electronic device according to various example embodiments.

FIG. 6B is a diagram illustrating the structure of the second layer of the flexible printed circuit board 500 among the components of an electronic device (e.g., the electronic device 101 of FIG. 1, the electronic device 201 of FIG. 2, the electronic device 300 of FIG. 3, or the electronic device 400 of FIG. 4) according to various example embodiments.

Referring to FIG. 6B, for example, the second layer of the flexible printed circuit board 500 may include the first and second portions 511 and 512 of the first coil 510, the second portion 522 of the second coil 520, and the second portion 532 of the third coil 530. The second portion 522 of the second coil 520 may be disposed inside the second portion 512 of the first coil 510. The first portion 511 of the first coil 510 may be disposed inside the second portion 522 of the second coil 520. The second portion 512 of the first coil 510 may surround the second portion 522 of the second coil 520. The second portion 522 of the second coil 520 may surround the first portion 511 of the first coil 510. When one face of the flexible printed circuit board 300 is viewed from above, the second portion 512 of the first coil 510 may be disposed such that the second portion does not have a portion that overlaps the second portion 532 of the third coil 530. The first portion 511 of the first coil 510 may include a start point of the first coil 510.

Figure 7:
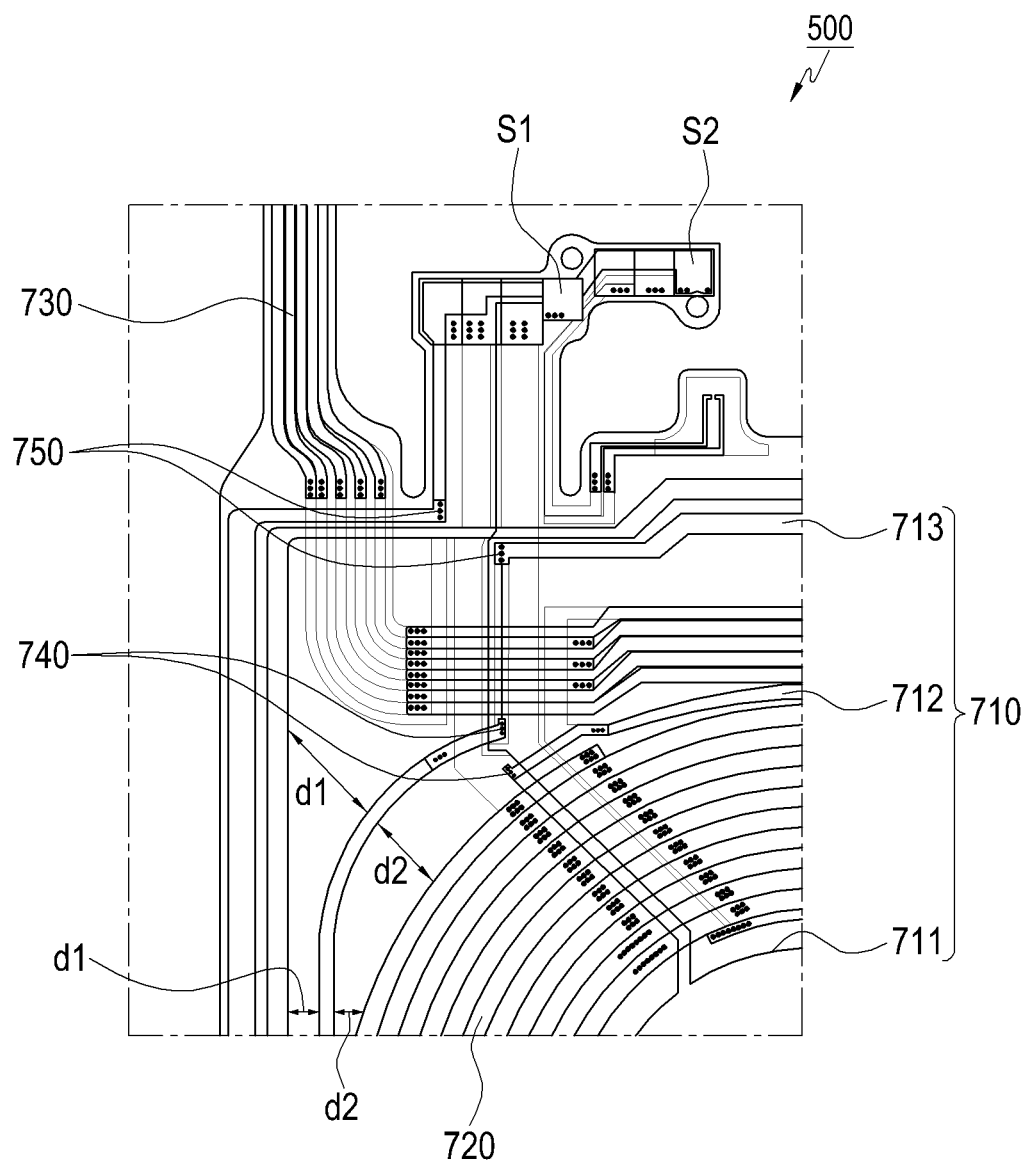
FIG. 7 is a diagram illustrating first and second connection wires among the components of the electronic device according to various example embodiments.

FIG. 7 is a diagram illustrating first and second connection wires 740 and 750 among the components of an electronic device (e.g., the electronic device 101 of FIG. 1, the electronic device 201 of FIG. 2, the electronic device 300 of FIG. 3, or the electronic device 400 of FIG. 4) according to various example embodiments.

Referring to FIG. 7, an electronic device (e.g., the electronic device 101 in FIG. 1, the electronic device 201 in FIG. 2, the electronic device 300 in FIG. 3, or the electronic device 400 in FIG. 4) may include the first and second connection wires 740 and 750. The first connection wire 740 may electrically connect the first portion 711 and the second portion 712 of the first coil 710. The second connection wire 750 may electrically connect the second portion 712 and the third portion 713 of the first coil 710.

According to an example embodiment, the first connection wire 740 may be disposed on the first layer of the flexible printed circuit board 700. The first connection wire 740 may electrically connect the first portion 711 and the second portion 712 of the first coil 710 via a via hole. The first connection wire 740 may extend from the inside of the loop, which is formed by at least one turn of the second coil 720, to the outside of the loop.

According to an example embodiment, the second connection wire 750 may be disposed on the first layer of the flexible printed circuit board 700. The second connection wire 750 may electrically connect the second portion 711 and the third portion 713 of the first coil 710 via a via hole. The second connection wire 750 may extend from the inside of a loop, which is formed by the second portion 712 of the second coil 710, to the outside of the loop.

According to an example embodiment, the first coil 710 may be formed in such a manner that the first coil 710 starts from the start point S1, passes through the inside of the pattern of the second coil 720, then forms the first portion 711 of the first coil 710 in a loop shape, and passes through the inside of the pattern of the second coil 720 again to be output to the outside. The first portion 711 of the first coil 710 may be electrically connected to one end of the second portion 712 of the first coil 710 by the first connection wire 740, and the other end of the second portion 712 of the first coil 710 may be electrically connected to one end of the third portion 713 of the first coil 710 by the second connection wire 750. The third portion of the first coil 710 may pass through the pattern of the third coil 730 and the other end of the third portion 713 may be connected to the end point S2 of the first coil 710.

According to various embodiments, the distance d1 of at least a part between the second portion 712 and the third portion 713 of the first coil 710 may be larger than the distance d2 between the second portion 712 and the second coil 720. Due to this, the interference between the coils 710 and 720 can be reduced, a recognition region of at least one of the coils 710 and 720 can be enlarged, and communication performance can be improved as well.

According to various embodiments, due to a component of the electronic device (e.g., the electronic device 101 of FIG. 3) in a partial section of the electronic device (e.g., the electronic device 101 of FIG. 3), in a part of the second portion 712 of the first coil 710, the distance d1 of a part between the second portion 712 and the third portion 713 of the first coil 710 may be smaller than the distance d2 between the second portion 712 and the second coil 720.

Figure 8A:
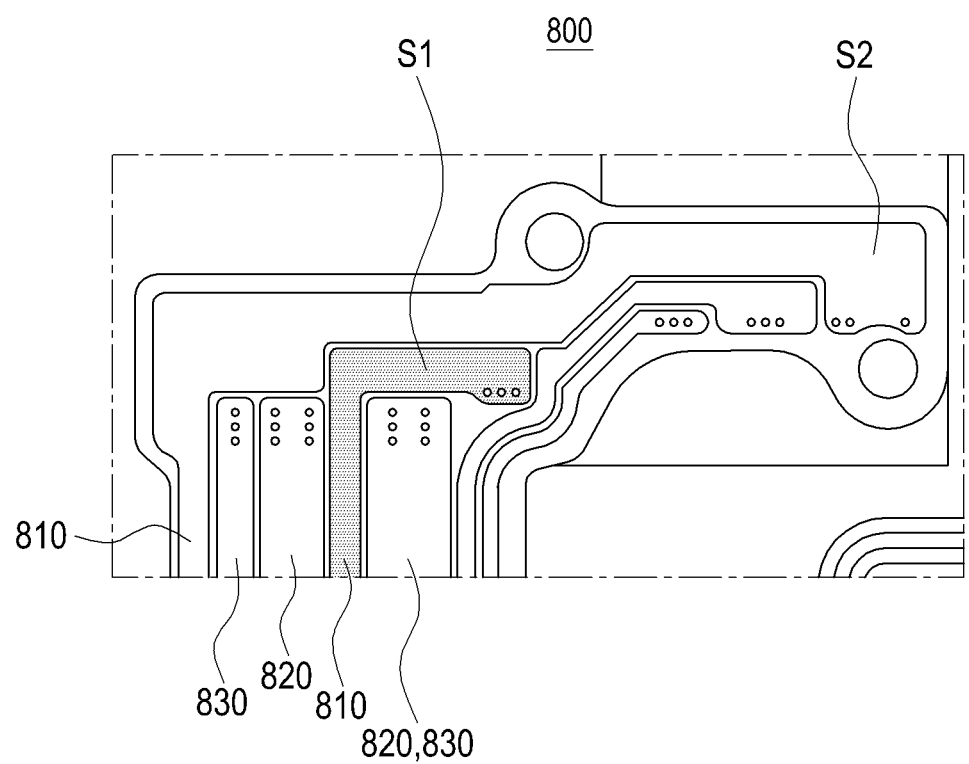
FIG. 8A is a diagram illustrating an example of a start point of a coil among the components of the electronic device according to \various example embodiments.
Figure 8B:
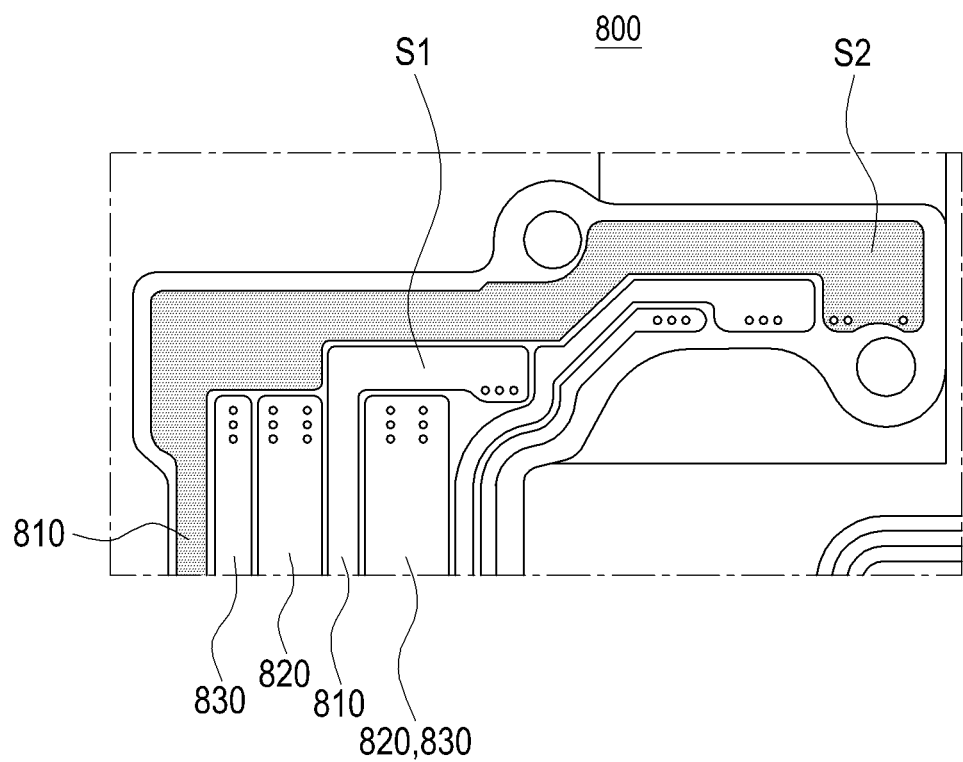
FIG. 8B is a diagram illustrating an example of an end point of the coil among the components of the electronic device according to various example embodiments.

FIGS. 8A and 8B are diagrams illustrating ends of coils in the flexible printed circuit board among the components of an electronic device (e.g., the electronic device 101 of FIG. 1, the electronic device 201 of FIG. 2, the electronic device 300 of FIG. 3, or the electronic device 400 of FIG. 4) according to various example embodiments.

Referring to FIGS. 8A and 8B, the ends of first, second, and third coils 810, 820, and 830 are illustrated. The first coil 810 may be, for example, an NFC coil. The second coil 820 may be, for example, a WPC coil. The third coil 830 may be, for example, an MST coil. The first, second, and third coils 810, 820, and 830 may have a start point (+) or an end point (−) for connecting a communication circuit.

According to an example embodiment, the first coil 810 may be connected to the end point S2 through the first, second, and third portions of the loop shape of the first coil 810, starting from a start point S1. When current is applied to the start point S1 of the first coil 810, the current may be applied from the start point S1 toward the end point S2 of the first coil 810. The first, second, and third portions of the first coil 810 can emit a signal based on the applied current.

The second coil 820 may start from the start point thereof, may form the second coil 820 in a loop shape, and may be connected to the end point of the second coil 820.

The third coil 830 may start from the start point of the third coil 830, may form the third coil 830 in a loop shape, and may be connected to the end point of the third coil 830.

When current is applied to the start point of the second and third coils 820 and 830, the current may be applied from the start point toward the end point of the second and third coils 820 and 830. At this time, the second and third coils 820 and 830 can emit an electromagnetic field based on the applied current.

Figure 9:
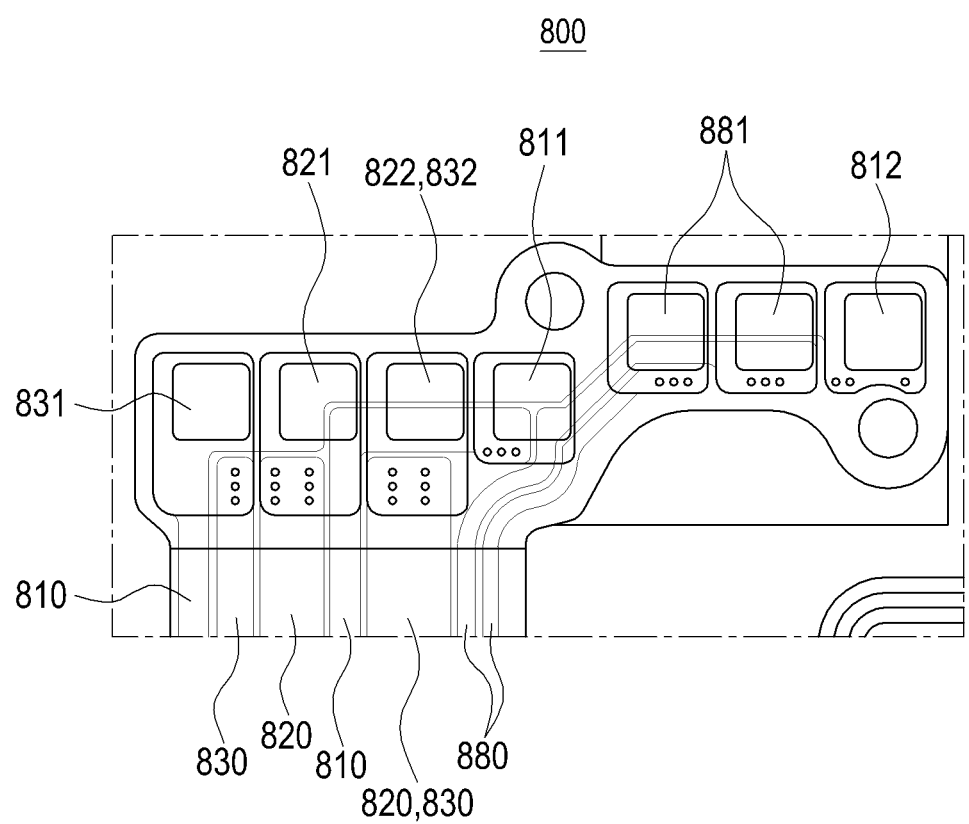
FIG. 9 is a diagram illustrating a coil terminal among the components of the electronic device according to various example embodiments.

FIG. 9 is a diagram illustrating terminals of a flexible printed circuit board among the components of an electronic device (e.g., the electronic device 101 of FIG. 1, the electronic device 201 of FIG. 2, the electronic device 300 of FIG. 3, or the electronic device 400 of FIG. 4) according to various example embodiments.

Referring to FIG. 9, the first, second, and third coils 810, 820, and 830 may be connected to corresponding connection terminals. The first coil 810 may be connected to, for example, an NFC connection terminal 811 and an NFC output terminal 812. The second coil 820 may be connected to, for example, a wireless charging connection terminal 821 and a wireless connection terminal 822. The third coil 830 may be connected to, for example, an MST connection terminal 831 and an MST connection terminal 832. As illustrated in FIG. 9, according to an example embodiment, a part of the wireless charging coil 820 may be used as a part of the MST output coil 830, and the wireless charging connection terminal 822 and the MST connection terminal 832 may share one terminal. The first, second, and third coils 810, 820, and 830 may input/output a signal through a connection terminal.

According to an example embodiment, current may be supplied to the first coil 810 through the connection terminal 811 of the first coil 810. For example, an electromagnetic field may be formed by a current flowing along the first coil 810 through the connection terminal 811. The current flowing along the first coil 810 is able to form an electromagnetic field while flowing along the first, second, and third portions of the first coil 810. The current flowing along the first coil 810 may be output to the connection terminal 812 connected to the first coil 810.

According to an example embodiment, current may be supplied to the second coil 820 through the connection terminal 821 of the second coil 820. For example, the current input through the connection terminal 821 is able to form an electromagnetic field while flowing along the second coil 820. The current flowing along the second coil 820 may be output through the connection terminal 822 connected to the second coil 820.

According to an example embodiment, current may be supplied to the third coil 830 through the connection terminal 831 of the third coil 830. For example, the current input through the connection terminal 831 is able to form an electromagnetic field while flowing along the third coil 830. The current flowing along the third coil 830 may be output through the connection terminal 832 connected to the third coil 830.

According to an example embodiment, A temperature measurement circuit and a connection terminal 881 for the temperature measurement circuit may be disposed on the flexible printed circuit board 800. When current is applied to the coil 880, the temperature measurement circuit may measure the temperature due to heat that can be generated, and may transmit the measured temperature to the processor. The processor may adjust the magnitude of the applied current based on the received temperature. Thus, overheating of the coils can be prevented and/or reduced.

Figure 10:
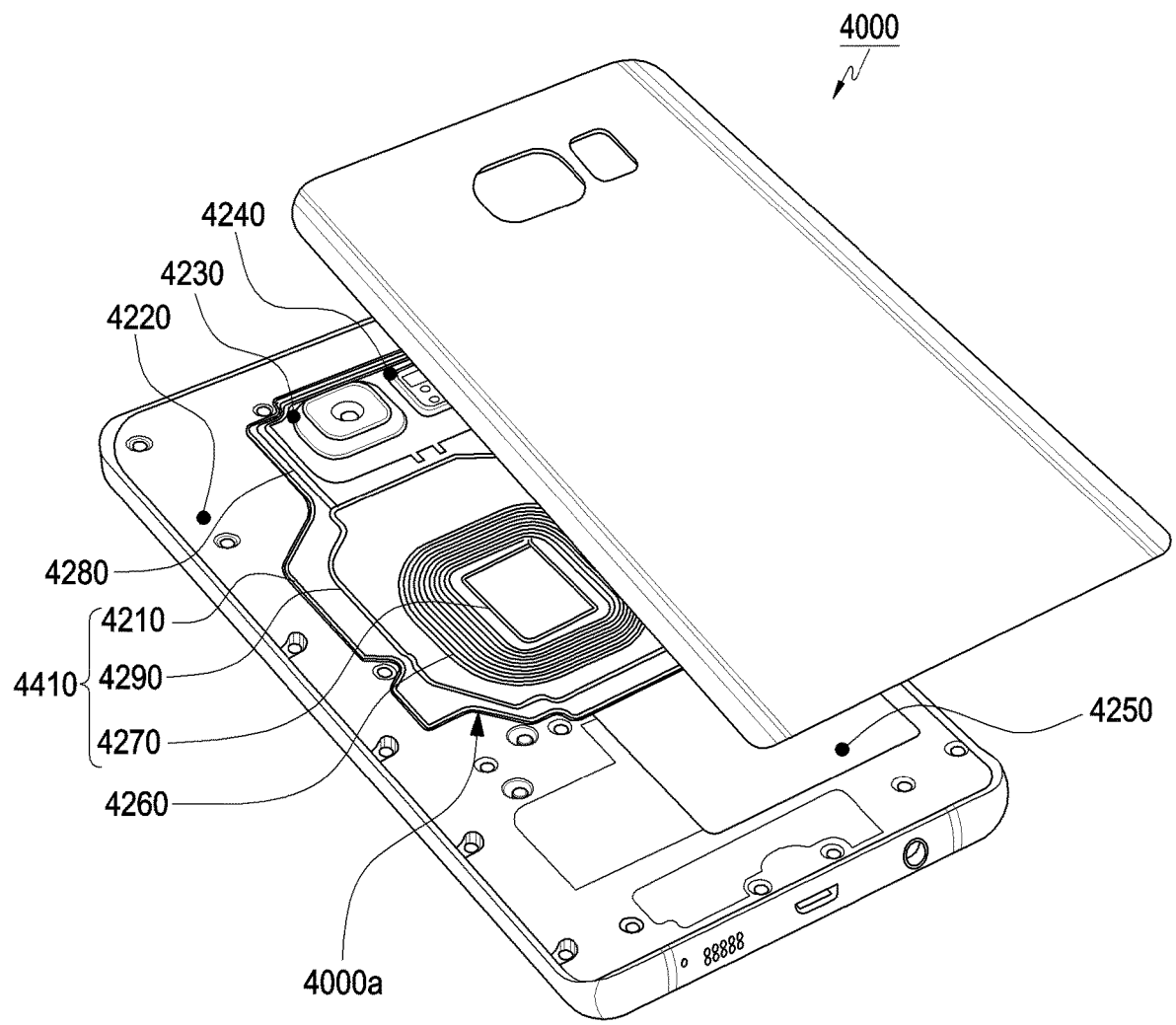
FIG. 10 is an exploded perspective view illustrating the state in which a flexible printed circuit board is mounted in an electronic device according to various embodiments.

FIG. 10 is an exploded perspective view illustrating a state in which a flexible printed circuit board 4000a is mounted in an electronic device 4000 according to various example embodiments.

Referring to FIG. 10, inside the housing of the electronic device 4000 (e.g., the electronic device 101 of FIG. 1, the electronic device 201 of FIG. 2, the electronic device 300 of FIG. 3, or the electronic device 400 of FIG. 4), the flexible printed circuit board 4000a including first, second, and third coils 4410, 4260, and 4280 may be mounted adjacent to the rear face of the housing 4220. For example, the first coil 4410 (e.g., an NFC coil) may include first, second, and third portions 4270, 4290, and 4210. Inside the second coil 4260 (e.g., a wireless charging coil), the first portion 4270 of the first coil 4410 may be disposed. Outside the second coil 4260, the second portion 4290 of the first coil 4410 may be disposed. Outside the second portion 4290 of the first coil 4410, the third portion 4210 of the first coil 4410 may be disposed. At least a part of the third portion 4210 may be disposed to overlap at least a part of the third coil 4280 (e.g., an MST coil) when viewed from above the rear face of the electronic device.

According to an example embodiment, a battery 4250 may be disposed between the flexible printed circuit board 4000a and the first face of the electronic device. A camera 4230 or a sensor 4240 may be disposed inside the flexible printed circuit board 4000a when viewed from above the second face of the electronic device. For example, at least one coil (e.g., the third coil 4280) included in the flexible printed circuit board 4000a may surround the camera 4230 or the sensor 4240. The first, second, and third coils 4410, 4260, and 4280 of the flexible printed circuit board 4000a may be designed to bypass the coil pattern in order to avoid overlapping with components such as the camera 4230 and the sensor 4240.

According to an example embodiment, the flexible printed circuit board may have other members attached to at least one of the upper face and the lower face thereof. For example, a heat insulating material (e.g., a graphite sheet) for preventing and/or reducing thermal diffusion or a shielding material (e.g., a shielding sheet) for preventing and/or reducing other components from being damaged by a strong induced electromagnetic field may be attached to at least one of the upper face and the lower face of the flexible printed circuit board 4000a. As another example, a protective film for preventing and/or reducing the flexible printed circuit board 4000a from being damaged may be attached.

Figure 11:
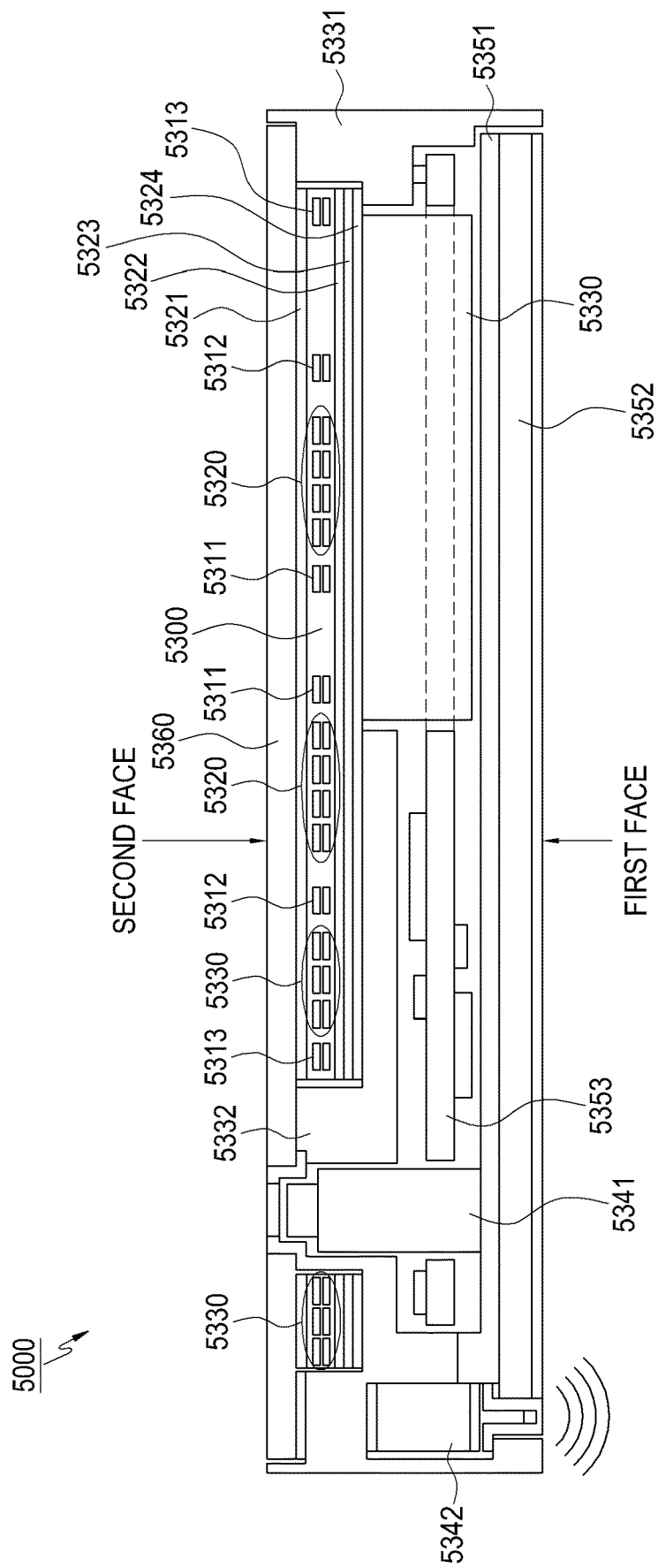
FIG. 11 is a side sectional view illustrating an electronic device according to various embodiments.

FIG. 11 is a diagram illustrating a side cross-sectional view of an electronic device 5000 according to various example embodiments. According to various embodiments, the electronic device 5000 may include a display 5352, a first support member 5351, a PCB 5353, a battery, a second support member 5332, a camera 5341, a flexible printed circuit board, or a receiver 5342. According to various embodiments, the components included in the electronic device 5000 may be the same as or different from those included in the electronic device 400 of FIG. 4. For example, at least one (e.g., the second support member 5332) of the components included in electronic device 5000 may be omitted.

Referring to FIG. 11, a display 5352 may be disposed on the first face of the housing of the electronic device 5000. A PCB 5353 on which multiple elements are mounted may be disposed between the first support member 5351 and the second support member 5332. A flexible printed circuit board 5300 (e.g., the flexible printed circuit board 4000a of FIG. 10) including one or more coils 5313, 5320, 5311, 5312, and 5330 may be disposed between the second support member 5332 and the second face (a cover 5360) of the housing. For example, the coils 5311, 5312, 5313, 5320, and 5330 may include first coils 5311, 5312, and 5313, a second coil 5320, and a third coil 5330. The first coil may be an NFC coil. The second coil may be a wireless charging coil. The third coil may be an MST coil. The first coil may include, for example, first, second, and third portions.

According to an example embodiment, the coils 5311, 5312, 5313, 5320, 5330 may have multiple layers. Although not illustrated, a conductor for interlayer, for example, a via set may be disposed. A protective film 5321 may be disposed between the flexible printed circuit board 5300 and the cover 5360 (e.g., glass). An adhesive layer 5324, a graphite sheet 5323, or a protective sheet 5322 may be disposed between the second support member 5332 and the battery 5330, and the flexible printed circuit board 5300. A side housing 5331 may be formed integrally with or coupled to a rear housing 5332.

Figure 12:
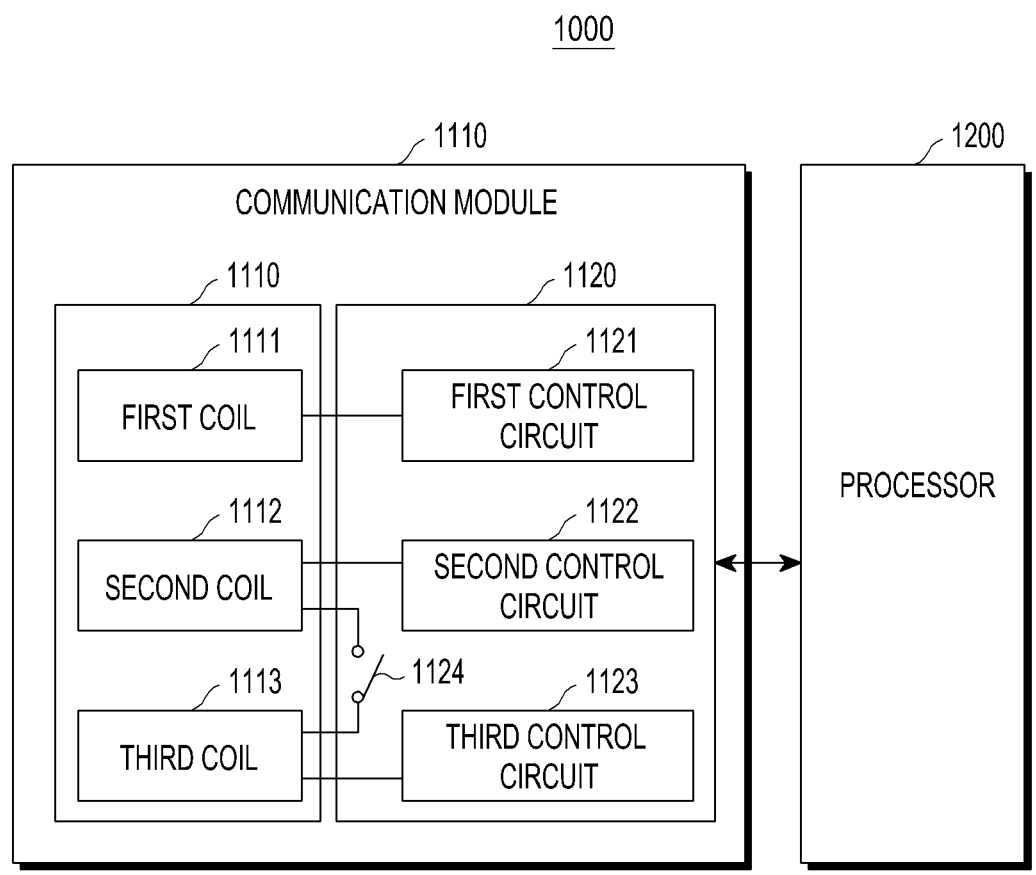
FIG. 12 is a block diagram illustrating an electronic device according to various embodiments.

FIG. 12 is a block diagram illustrating the configuration of an electronic device according to various example embodiments.

Referring to FIG. 12, an electronic device 1000 (e.g., the electronic device 101 of FIG. 1, the electronic device 201 of FIG. 2, the electronic device 300 of FIG. 3, or the electronic device 400 of FIG. 4) may include a communication module (e.g., including communication circuitry) 1100 and a processor (e.g., including processing circuitry) 1200. According to an example embodiment, the communication module 1100 may include an antenna module 1110 and an antenna control module (e.g., a control circuit) 1120.

According to an example embodiment, the antenna module 1110 may include various antennas (e.g., coils) that transmit/receive signals to/from an external device under the control of the antenna control module 1120. The antenna module 1110 may include multiple antennas 1111, 1112, and 1113 (e.g., a coil antenna or a metal antenna). According to an example embodiment, the antenna module 1110 may include a first coil 1111. The first coil 1111 may be an NFC coil having a resonance frequency which is set to perform NFC communication, for example. For example, the antenna module 1110 may perform NFC communication with an NFC reader, an NFC tag, or an external electronic device. According to an example embodiment, the antenna module 1110 may include a second coil 1112. The second coil 1112 may be, for example, a wireless charging coil. According to an example embodiment, the antenna module 1110 may include a third coil 1113. The third coil 1113 may be, for example, an MST coil.

According to an example embodiment, the antenna control module 1120 may include various control circuitry, such as, for example, and without limitation, a processor for processing data transmitted and received via the antenna module 1110. According to an example embodiment, the antenna control module 1120 may supply a signal, which is to be transmitted to an external device by the antenna module 1110, and may receive and process a signal received from the external device to the antenna module 1110. The antenna control module 1120 may include multiple control circuits 1121, 1122, and 1123.

According to an example embodiment, the antenna control module 1120 may include a first control circuit 1121, which transmits a signal to the outside by a first transmission method using the first coil 1111. For example, the first control circuit 1121 may be an NFC module for performing NFC communication. According to an example embodiment, the first control circuit 1121 may be implemented as a chip (e.g., an IC chip) designed to perform NFC communication. According to an example embodiment, the antenna control module 1120 (e.g., an NFC module) may operate in a reader (read/write) mode, a card (card emulation mode), or a P2P (peer-to-peer) mode. According to an example embodiment, the antenna control module 1120 may change the operating mode under the control of the processor 1200. According to an example embodiment, the processor 1200 may control the overall operation of the electronic device 1000. According to an example embodiment, the processor 1200 may control the antenna control module 1120 so as to transmit/receive data to/from an external device according to various embodiments. According to an example embodiment, the antenna control module 1120 may include a second control circuit 1122, which transmits a signal to the outside by a second transmission method using the second coil 1112. For example, the second control circuit 1122 may be a wireless charging module for performing wireless charging. According to an example embodiment, the second control circuit 1122 may be implemented as a chip designed to perform wireless charging. According to an example embodiment, the antenna control module 1120 may include a third control circuit 1123, which transmits a signal to the outside by a third transmission method using the third coil 1113. For example, the third control circuit 1123 may be an MST module for performing MST communication. According to an example embodiment, the third control circuit 1123 may be implemented as a chip designed to perform MST communication.

According to an example embodiment, the antenna control module 1120 may include a switch 1124 connected between the second coil 1112 and the third coil 1113. The antenna control module 1120 or the processor 1200 may control the on/off of the switch 1124. For example, the switch may be controlled by the second control circuit 1122 or the third control circuit 1123.

According to an example embodiment, the antenna control module 1120 or the processor 1200 may be configured to transmit a signal to the outside by the second transmission method using the second coil 1112 and the third coil 1113 and to transmit a signal to the outside by the third transmission method only using the third coil 1113. According to another embodiment, the antenna control module 1120 or the processor 1120 may be configured to selectively connect the second coil 1112 and the third coil 1113 using the switch 1124 at the time of transmitting a signal by the second transmission method and at the time of transmitting a signal by the third transmission method using the third transmission method.

Figure 13:
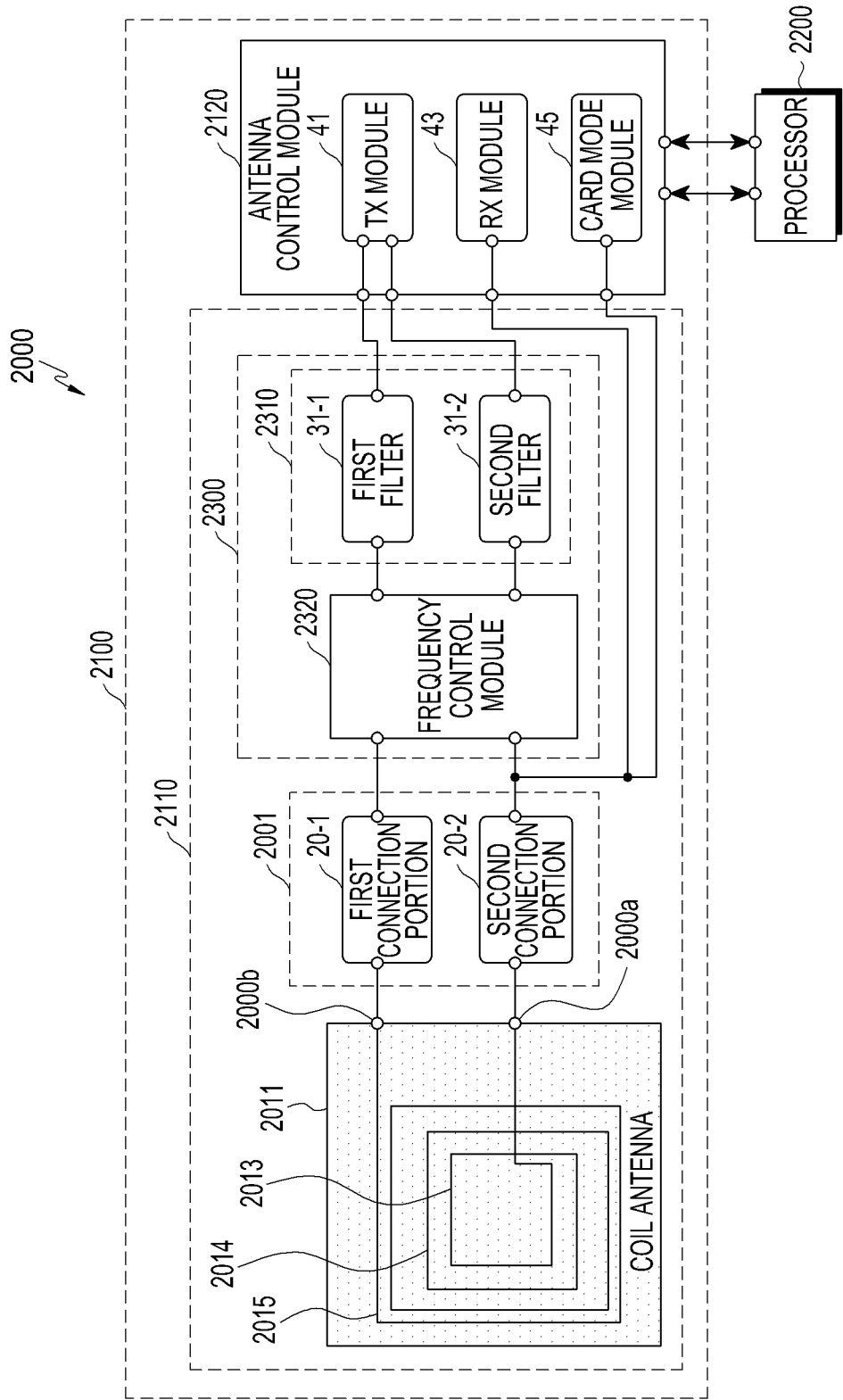
FIG. 13 is a block diagram illustrating a structure of a first coil according to various embodiments.

FIG. 13 is a block diagram illustrating the configuration of an electronic device 2000 according to various example embodiments.

Referring to FIG. 13, the electronic device 2000 may include a communication module 2100 (e.g., the communication module 110 of FIG. 1) and a processor 220.

According to an example embodiment, the communication module 2100 may include an antenna module 2110 and an antenna control module 2120. According to an example embodiment, the antenna module 2110 may include a coil antenna 2011, a connection unit 2001, and a signal processing module 2300.

According to an example embodiment, the coil 2011 may include a first portion 2013, a second portion 2014, and a third portion 2015. According to an example embodiment, the first portion 2013 may be one or more turns in the form of a loop that is rotated a predetermined number of times in a predetermined direction. According to an example embodiment, the second portion 2014 may be at least one turn in the form of a loop, which extends from the first portion 2013 and is rotated a predetermined number of times in a predetermined direction. The third portion 2015 may be at least one turn in the form of a loop, which extends from the second portion 2014 and is rotated a predetermined number of times in a predetermined direction. For example, the first portion 2013, the second portion 2014, and the third portion 2015 may be electrically connected to each other.

According to an example embodiment, each of one ends of the first portion 2013, the second portion 2014, and the third portion 2015 may be connected to a connection terminal. For example, one end of the first portion 2013 may be connected to the first connection terminal 2000a, and one end of the third portion 2015 may be connected to the second connection terminal 2000b. The first portion 2013 and the third portion 2015 may input/output a signal through the first connection terminal 2000a and the second connection terminal 2000b, respectively.

According to an example embodiment, at least one coil included in the coil 2011 may be formed on the same (or one) plane. For example, the first portion 2013, the second portion 2014, and the third portion 2015 may be formed in at least a partial region of the same printed circuit board (e.g., a flexible printed circuit board). The description "the first portion 2013, the second portion 2014, and the third portion 2015 are formed on the same plane" may include, for example, not only a case in which the first portion 2013, the second portion 2014, and the third portion 2015 are formed in one layer, but also a case in which the first portion 2013, the second portion 2014, and the third portion 2015 are formed in multiple layers. According to an example embodiment, the first portion 2013 may be disposed within the loop formed by the second portion 2014. The second portion 2014 may be disposed within the loop formed by the third portion 2015.

According to an example embodiment, the first portion 2013, the second portion 2014, and the third portion 2015 may be disposed to be spaced apart from each other by a predetermined distance or more. For example, the third portion 2015 may be positioned such that the intensity of the electromagnetic field formed outside the loop formed by the second portion 2014 is equal to or greater than a predetermined intensity in all regions. There may be a region outside the loop formed by the first portion 2013 in which the intensity of the electromagnetic field does not satisfy a predetermined condition. According to an example embodiment, the second portion 2014 may be disposed in at least a partial region in which the electromagnetic field does not satisfy the predetermined condition. In another example, the second portion 2014 may be disposed in order to enable communication in a region in which the intensity of the electromagnetic field does not satisfy the predetermined condition within the loop formed by the third portion 2015.

According to an example embodiment, the first portion 2013, the second portion 2014, and the third portion 2015 may have the same rotation direction. For example, the first portion 2013, the second portion 2014, and the third portion 2015 may be disposed such that the direction of the current flowing along the coil is the same. For example, when the current flowing along the first portion 2013 rotates clockwise, the current flowing along the second and third portions 2014 and 2015 may rotate clockwise.

As another example, when the current flowing along the first portion 2013 rotates counterclockwise, the current flowing along the second and third portions 2014 and 2015 may rotate counterclockwise. When the first portion 2013, the second portion 2014, and the third portion 2015 have the same rotation direction, the electromagnetic field generated by the first portion 2013 and the electromagnetic field generated by the second portion 2014 and the third portion 2015 may overlap each other, so that the intensity of the electromagnetic field formed around the coil can be increased.

According to an example embodiment, the first portion 2013, the second portion 2014, and the third portion 2015 may have the same number of rotations. For example, when the first portion 2013, the second portion 2014, and the third portion 2015 have the same number of rotations, the increase width in the intensity of the electromagnetic field may be large.

According to an example embodiment, it is possible to adjust the number of rotations of the first portion 2013 and the third portion 2015 such that a tag in the region inside the loop formed by the second portion 2014 can be stably recognized according to the positions of the first portion 2013, the second portion 2014, and the third portions 2015 (no communication-disabled region exists).

According to various embodiments, when the antenna control module 2120 (e.g., an NFC module) operates in the reader mode, as the number of rotations of the first portion 2013, the second portion 2014, and the third portion 2015 increases, the intensity of the electromagnetic field becomes stronger so that the tag recognition performance can be enhanced. However, when the antenna control module 2120 operates in the card mode, the performance may be degraded due to collision with the electromagnetic field generated in the NFC reader. According to various embodiments, the number of rotations of the first portion 2013, the second portion 2014, and the third portion 2015 may be determined in consideration of both the performance of the reader mode and the performance of the card mode.

Table 1 is a table showing a case in which the first and third portions of a coil are used and a case in which all the first, second, and third portions of the coil are used.

TABLE 1

| | Use of NFC Coil | |
|---|---|---|
| | When only the first portion and the third portion are used | When all the first, second, and third portions are used |
| Small Tag Recognition Region | 65% | 76% |

Referring to Table 1, it can be seen that using all the first, second, and third portions of the coil improves the small tag recognition region, compared to using only the first and third portions of the coil. Therefore, it can be seen that the tag recognition performance is improved in the small tag recognition region in the first portion 2013, the second portion 2014, and the third portion 2015 of the coil.

According to various embodiments, the connection portion 2001 may electrically connect the coil 2011 with another component (e.g., the signal processing module 2300 or the antenna control module 2120). According to an example embodiment, the connection portion 2001 may include a C-clip. According to an example embodiment, the connection portion 2001 may include a first connection portion 20-1 and a second connection portion 20-2. According to an example embodiment, the first connection portion 20-1 may electrically connect one end of the first coil 2013 (or the first connection terminal 2000a) and the signal processing module 2300 to each other. According to an example embodiment, the second connection portion 20-2 may electrically connect one end of the third portion 2015 (or the second connection terminal 2000b) and the signal processing module 2300 or the antenna control module 2120 to each other.

According to various embodiments, the signal processing module 2300 may process signals received from the antenna control module 2120 and may transmit the processed signals to the coil 2011. According to an example embodiment, the signal processing module 2300 may include a filter module 2310 and/or a frequency control module 2320.

According to an example embodiment, the filter module 2310 may filter signals received from the antenna control module 2120 and may transmit the processed signals to the frequency control module 2320. For example, the filter module 2310 may filter signals received from the antenna control module 2120 and may transmit only the signals having a predetermined frequency band to the frequency control module 2320. According to an example embodiment, the filter module 2310 may include a low-pass filter. According to an example embodiment, the filter module 2310 may include a band-pass filter or a band-rejection filter.

According to various embodiments, the frequency control module 2320 may control the resonant frequency of the coil 2011. According to an example embodiment, the frequency control module 2320 may include an RLC element (or circuit). The frequency control module 2320 may adjust the resonance frequency of the coil 2011 using the RLC element. For example, the frequency control module 2320 may adjust the resonance frequency of the coil antenna to an NFC communication frequency (e.g., 13.56 MHz). According to an example embodiment, the frequency control module 2320 may optimize the operating environment by adjusting the resonance frequency according to the operation mode of the antenna control module 2120 (e.g., the reader mode or the card mode).

According to an example embodiment, the antenna control module 2120 may supply a signal, which is to be transmitted to an external device by the antenna module 2211, and may receive and analyze a signal received from the external device to the antenna module 2211.

According to an example embodiment, the antenna control module 2120 (e.g., an NFC module) may operate in at least one of a reader (read/write) mode, a card (card emulation) mode, and a P2P (peer-to-peer) mode under the control of the processor 2220.

According to an example embodiment, the antenna control module 2120 may include a Transmitter X-tal (TX) module 41, a Receiver X-tal (RX) module 43, and/or a card mode module 45. According to an example embodiment, the TX module 41 and/or the RX module 43 can be activated when the antenna control module 2120 operates in the reader mode or the P2P mode.

According to an example embodiment, the card mode module 45 can be activated when the antenna control module 2120 operates in the card mode.

According to an example embodiment, the TX module 41 may generate a signal to be transmitted to the antenna module 2211. For example, the TX module 41 may generate a signal according to an NFC protocol. According to an example embodiment, the TX module 41 may include an encoder for encoding the generated signal. According to an example embodiment, the TX module 41 may include an amplifier circuit for amplifying the power of the generated signal. The signal generated by the TX module 41 may be transmitted to an antenna module (e.g., a signal processing module).

According to an example embodiment, the RX module 43 may receive a signal output from the TX module 41 to the antenna module 2211. The signal received from the antenna module 2211 may include an NFC tag or data received from an external device.

According to an example embodiment, the RX module may include a decoder for decoding the received signal. The RX module 43 may transmit the information contained in the received signal to the processor 2220.

According to an example embodiment, the card mode module 45 may receive a signal, which is received from an external device (e.g., a Point-Of-Sale (POS terminal) to the antenna module 2211 in the state in which the antenna control module 2112 operates in the card mode.

According to an example embodiment, the antenna control module 2120 may include at least one terminal (e.g., a connection terminal) for transmitting/receiving signals to/from an external (e.g., the antenna module 2211 or the processor 2220). For example, the antenna control module 2120 may include a first terminal and a second terminal, which are coupled to the TX module 41. The first terminal may be electrically connected to, for example, the first connection terminal 2000a of the coil 2011, and the second terminal may be electrically connected to, for example, the second connection terminal 2000b of the coil 2011.

Figure 14:
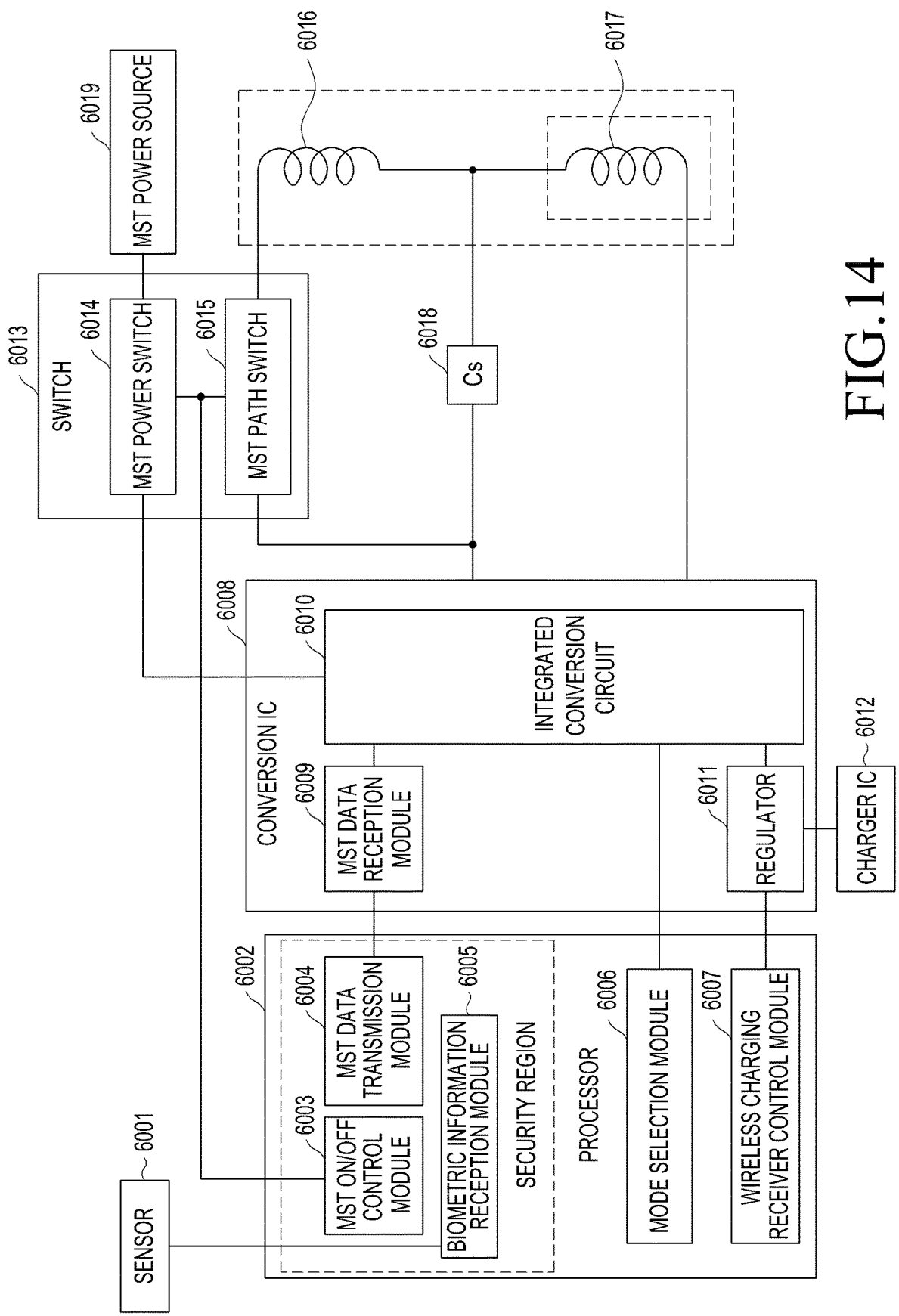
FIG. 14 is a block diagram illustrating a second coil (e.g., a wireless charging coil) and a third coil (e.g., an MST coil) among the components of an electronic device according to various embodiments.

FIG. 14 is a block diagram illustrating an example of a second coil (e.g., a wireless charging coil) and a third coil (e.g., an MST coil) among the components of an electronic device according to various example embodiments.

Referring to FIG. 14, an electronic device (e.g., the electronic device 101 of FIG. 1, the electronic device 201 of FIG. 2, the electronic device 300 of FIG. 3, or the electronic device 400) capable of performing MST and wireless charging may include a sensor 6001, a processor 6002, a conversion IC 6008, a charger IC 6012, a switch 6013, coils 6016 and 6017, a capacitor 6018, and an MST power source 6019. The sensor 6001 may include an image sensor capable of sensing an iris or a fingerprint sensor capable of acquiring a fingerprint. The sensor 6001 may also include various sensors capable of acquiring the user's biometric information which can be used for authentication. The biometric information sensed by the sensor 6001 may be transmitted to the processor 6002.

A biometric information reception module 6005 may receive the biometric information sensed by the sensor 6001. The biometric information reception module 6005 may compare the stored biometric information with the sensed biometric information, and may perform authentication according to the comparison result. In various embodiments, storage of biometric information and processing of the sensed biometric information may be performed in a security region within the processor 6002, thereby preventing and/or reducing leakage of the user's biometric information.

The wireless charging receiver control module 6007 may perform control to transmit information from the electronic device to the wireless power transmission device. For example, when the electronic device performs wireless charging in accordance with a Wireless Power Consortium (WPC) standard (or a Qi standard), the electronic device communicates with the wireless power transmission device in an in-band manner. The wireless charging receiver control module 6007 may include therein a dummy load (e.g., a resistor or a capacitor) and a switch capable of selectively connecting the dummy load to the second coil 6017.

The wireless charging receiver control module 6007 may turn on/off the switch in accordance with, for example, an on/off keying scheme, so that the dummy load can be connected to disconnected from the second coil 6017. The wireless power transmission device is capable of detecting that the load of the electronic device is changed, and is capable of determining, for example, a change in the load of the electronic device according to a change in the magnitude of the voltage sensed in a primary coil. For example, when the wireless charging receiver control module 6007 is to transmit data of "10010," during a first period, the wireless charging receiver control module 6007 may maintain a first load state by disconnecting the dummy load; thereafter, during the first period, the wireless charging receiver control module 6007 may maintain a second load state by connecting the dummy load; thereafter, during the first period, the wireless charging receiver control module 6007 may maintain a second load state by connecting the dummy load; thereafter, during the first period, the wireless charging receiver module 6007 may maintain the first load state by disconnecting the dummy load; and thereafter, during the first period, the wireless charging receiver module 6007 may maintain the second load state by connecting the dummy load. The wireless power transmission device is able to detect that, for example, the magnitude of voltage of the primary coil varies in the order of a first magnitude-a second magnitude-a second magnitude-a first magnitude-a second magnitude, and as a result, the wireless power transmission device is able to acquire data "10010." As described above, the wireless charging receiver control module 6007 is able to perform the transmission of a wireless charging signal by performing on/off keying modulation. In still another embodiment, the wireless charging receiver control module 6007 may apply the modulated current to the second coil 6017, and may perform the transmission of a wireless signal by forming an electromagnetic field generated by the modulated current. The wireless charging receiver control module 6007 may control the entire operation of performing wireless charging.

In various embodiments, the MST operation may be interrupted when the wireless charging receiver control module 6007 detects the initiation of wireless charging or performs the transmission of a wireless charging signal. A mode selection module 6006 may perform selection such that the integrated conversion circuit 6010 in the conversion IC 6008 performs the rectification operation while the initiation of wireless charging is detected or the transmission of a wireless charging signal is performed. While the initiation of wireless charging is detected or the transmission of a wireless charging signal is performed, the MST on/off control module 6003 may control the MST power switch 6014 to be in an off state, and thus power for MST operation may not be applied from the MST power source 6019 to the integrated conversion circuit 6010. The MST power switch 6014 may selectively connect or disconnect the MST power source 6019 and the integrated conversion circuit 6010. While the initiation of wireless charging is detected or the transmission of a wireless charging signal is performed, the MST on/off control module 6003 may control the MST path switch 6015 to be in the off state, and thus the third coil 6016 may not be connected to the integrated conversion circuit 6010. The MST path switch 6015 may selectively connect or disconnect the third conversion circuit 6010 and the third coil 6016. As the above described switches 6014 and 6015 are controlled to be in the off state, the third coil 6016 may not be connected to the integrated conversion circuit 6010 and only the second coil 6017 may be connected to the integrated conversion circuit 6010. The capacitor 6018 may constitute a resonance circuit together with the second coil 6017, and may have a capacitance to have a resonance frequency (e.g., 100 to 205 kHz) defined in the WPC standard, for example. The integrated conversion circuit 6010 may be used as a rectification circuit under the control of the mode selection module 6006. Accordingly, alternating current output from the second coil 6017 can be rectified by the integrated conversion circuit 6010, and the rectified current can be regulated by a regulator 11 (e.g., a Low Drop-Out (LDO) regulator) may be transmitted to the charger IC 6012. The charger IC 6012 is able to charge the battery by adjusting the received current to be suitable for battery charging. As described above, when the wireless charging is performed or when the wireless charging signal is transmitted, the MST operation may not be performed.

The electronic device may be set to perform the MST operation when it is not a case in which the wireless charging is performed or a wireless charging signal is transmitted. The mode selection module 6006 may perform selection such that the integration conversion circuit 6010 performs inversion. When it is not a case in which the wireless charging is performed or a wireless charging signal is transmitted, the MST on/off control module 6003 may control the MST power switch 6014 to be in the on state, thereby causing the MST power source 6019 to be connected to the integrated conversion circuit 6010. When it is not a case in which the wireless charging is performed or a wireless charging signal is transmitted, the MST on/off control module 6003 may control the MST path switch 6015 to be in the on state, thereby causing one end of the third coil 6016 to be connected to the integrated conversion circuit 6010. Accordingly, both the third coil 6016 and the second coil 6017 can be connected to the integrated conversion circuit 6010. When the authentication is successful in the biometric information reception module 6005, the MST data stored in an MST data transmission module 6004 may be transferred to the MST data reception module 6009. The integrated conversion circuit 6010 may receive MST data from the MST data reception module 6009 and may convert the MST data into an MST signal using the power received from MST power source 6019. The MST signal may have the form of, for example, a square wave, but the shape of the MST signal is not limited. For example, the MST signal may have, for example, a molar tooth shape in which a constant part of a square wave is convex downwards. The MST signal may be applied to the second and third coils 6016 and 6017 and the second and third coils 6016 and 6017 may form an electromagnetic field based on the MST signal. As described above, when it is not a case in which the wireless charging is performed or a wireless charging signal is transmitted, the MST signal may be applied to the multiple coils 6016 and 6017, so that electromagnetic field formation through a coil having higher reactance can be enabled.

Figure 15A:
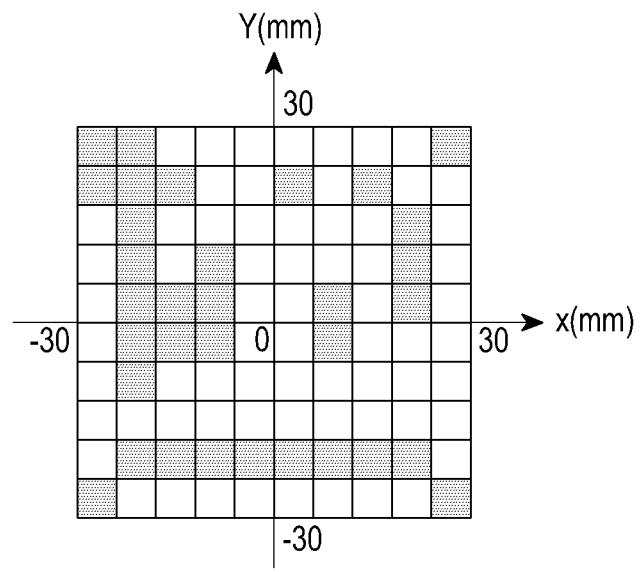
FIG. 15A is a diagram illustrating a signal-recognition success rate before coils according to various embodiments are improved.
Figure 15B:
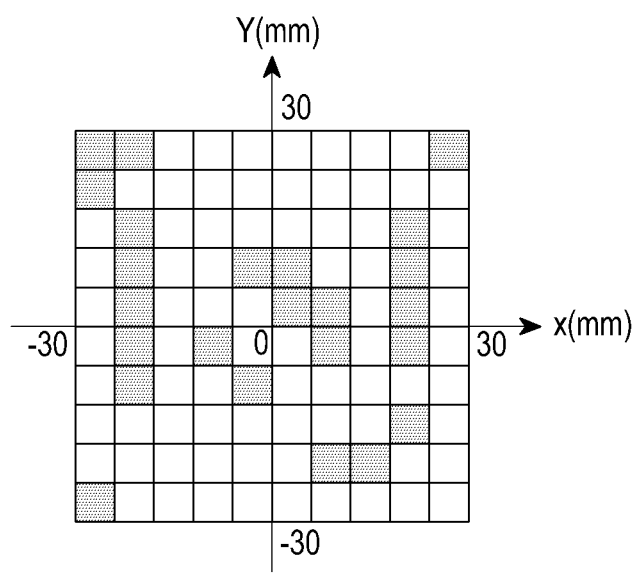
FIG. 15B is a diagram illustrating a signal-recognition success rate after coils according to various embodiments are improved.

FIGS. 15A and 15B are diagrams illustrating a recognition success rate for each position for performance comparison of comparative examples of first, second, and third coils (e.g., the coils 510, 520, and 530 of FIG. 5A) disposed on a flexible printed circuit board (e.g., the flexible printed circuit board 500 of FIG. 5A) according to various example embodiments.

The colors in the lattices in FIGS. 15A and 15B may indicate a recognition success rate of an NFC signal. For example, black indicates a lower recognition success rate, and white indicates a higher recognition success rate. On the other hand, for mixed colors of black and white, it can be seen that the higher the percentage of white is, the higher the recognition success rate is.

FIG. 15A may illustrate a situation before the NFC signal recognition is improved and in which an embodiment is not applied, and FIG. 15B may illustrate a situation after the NFC signal recognition is improved and in which the embodiment is applied. As can be seen from FIG. 15A, when the first, second, and third coils (e.g., the coils 510, 520, and 530 of FIG. 5A) according to the embodiment are not applied, more black rectangles appear compared to white rectangles. On the other hand, as can be seen from FIG. 15B, when the first, second, and third coils of the present disclosure (e.g., the coils 510, 520, and 530 of FIG. 5A) are applied, more white rectangles appear compared to black rectangles. This may mean that the recognizable range of the coil according to the present disclosure is relatively wide. For example, from FIG. 15B, it can be seen that the recognition success rate is relatively high with respect to the upper portion of the center 0, so that an electromagnetic field with a sufficient intensity is formed even in the second portion of the first coil 510 (e.g., the second portion 512 of FIG. 5A) and a null region of the second coil 520.

Figure 16:
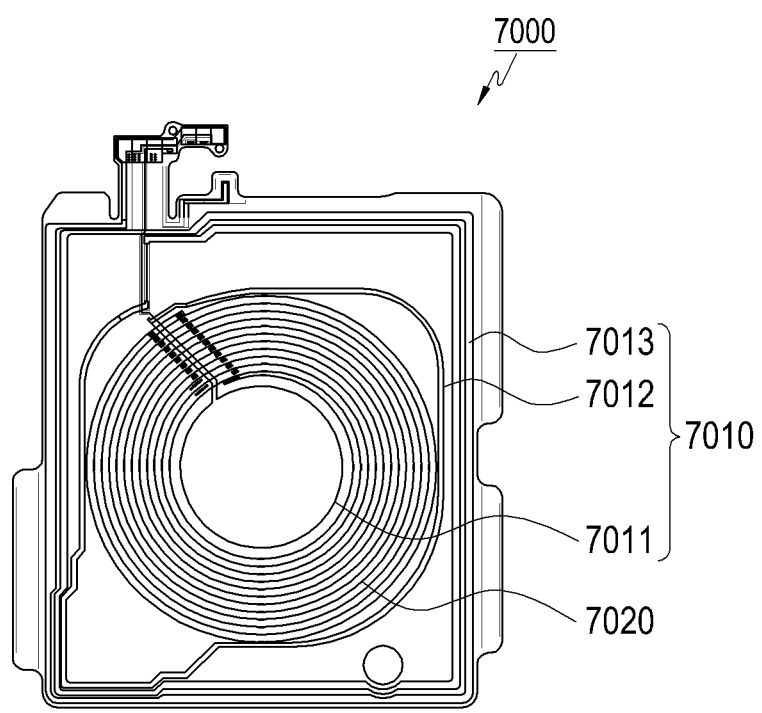
FIG. 16 is a diagram illustrating another structure of a flexible printed circuit board among the components of the electronic device according to various example embodiments.

FIG. 16 is a diagram illustrating the structure of a flexible printed circuit board 7000, which does not have a third coil (e.g., an MST coil), among the components of an electronic device (e.g., the electronic device 101 of FIG. 1, the electronic device 201 of FIG. 2, the electronic device 300 of FIG. 3, or the electronic device 400 of FIG. 4) according to various example embodiments.

Referring to FIG. 16, the flexible printed circuit board 7000 may include, for example, a first coil 7010 including at least one turn, and a second coil 7020 including at least one turn. The first coil 7010 may include first, second, and third portions 7011, 7012, and 7013. At least a part of the second coil 7020 may surround the first portion 7011 of the first coil 7010, the second portion 7012 of the first coil 7010 may surround at least a part of the second coil 7020, and the third portion 7013 of the first coil 7010 may surround the second portion 7012 of the first coil 7010.

According to an example embodiment, the second portion 7012 of the first coil 7010 may be disposed between the third portion 7013 and the second coil 7020, and the second coil 7020 may be disposed between the first portion 7011 and the second portion 7012 of the first coil 7010. The first portion of the first coil 7010 may be disposed inside the second coil 7020. The first, second, and third portions 7011, 7012, and 7013 of the first coil 7010 may include an NFC coil for NFC communication. The second coil 7020 may include a wireless charging coil for wireless charging.

According to an example embodiment, the first and second coils 7010 and 7020 disposed on a flexible printed circuit board may be operated by a communication module, an antenna module, an antenna control module, and a processor. The operations of the communication module, the antenna module, the antenna control module, and the processor are the same as those illustrated in FIG. 13, and thus will not be described further.

According to an example embodiment, the size and volume of the flexible printed circuit board 7000 can be reduced by disposing only the NFC coil 7010 and the wireless charging coil 7020 without the MST coil on the flexible printed circuit board 700. As a result, it is possible not only to downsize the electronic device, but also to reduce the manufacturing cost and assembly time of components.

According to an example embodiment, since the NFC coil 7010 is divided into first, second, and third portions 7011, 7012, and 7013, and MST coil interference, which may occur between the third portion 7013 of the NFC coil 7010 and the wireless charging coil 7020, is reduced, the performance can be improved.

According to various embodiments, an electronic device (e.g., the electronic device 101 of FIG. 1, the electronic device 201 of FIG. 2, the electronic device 300 of FIG. 3 and the electronic device 400 of FIG. 4) may include a housing (e.g., the housing 3001 in FIG. 3) including a first face facing a first direction and a second face facing a second direction different from the first direction; and a Flexible Printed Circuit Board (FPCB) (e.g., the Flexible Printed Circuit Board 500 of FIG. 5A) disposed between the first and second faces. The flexible printed circuit board may include a first coil (e.g., the coil 510 in FIG. 5A) including at least one turn, a second coil (e.g., the coil 520 of FIG. 5A) including at least one turn; and a third coil (e.g., the 530 of FIG. 5A) including at least one turn. At least a part of the second coil may surround a first portion of the first coil, a second portion of the first coil may surround at least a part of the second coil, a third portion of the first coil may surround the second portion, and at least a part of the third coil may be disposed between at least a part of the second portion of the first coil and at least a part of the third portion, the control circuit (e.g., the control circuit 1120 of FIG. 12) may configured to: transmit a signal outwards by a first transmission method using the first coil; transmit a signal outwards by a second transmission method using the second coil; and transmit a signal outwards by a third transmission method using the third coil.

According to various embodiments, the first transmission method may support transmission of an NFC signal, the second transmission method may support transmission of a wireless charging signal, and the third transmission method may support transmission of an MST magnetic signal corresponding to the magnetic settlement card.

According to various embodiments, the electronic device (e.g., the electronic device 101 of FIG. 1, the electronic device 201 of FIG. 2, the electronic device 300 of FIG. 3, or the electronic device 400 of FIG. 4) may further include: a first connection wire configured to electrically connect the first portion and the second portion of the first coil; and a second connection wire configured to electrically connect the second portion and the third portion of the first coil.

According to various embodiments, the flexible printed circuit board (e.g., the flexible printed circuit board 500 of FIG. 5A) may include at least two layers, the first connection wire may disposed on the first layer of the flexible printed circuit board, at least one of the first portion and the second portion of the first coil may be disposed on the second layer of the flexible printed circuit board, and the first connection wire may be electrically connected to at least one of the first portion and the second portion via a via hole.

According to various embodiments, the first connection wire may extend from an inner side of a loop, which is formed by at least one turn of the second coil, to an outer side of the loop.

According to various embodiments, the flexible printed circuit board (e.g., the flexible printed circuit board 500 of FIG. 5A) may include at least two layers, the second connection wire may be disposed on the first layer of the flexible printed circuit board, at least one of the second portion and the third portion of the first coil may be disposed on the second layer of the flexible printed circuit board, and the second connection wire may be electrically connected to at least one of the second portion and the third portion via the via hole.

According to various embodiments, the second connection wire may extend to the outer side of the loop from the inner side of the loop formed by the second portion of the first coil.

According to various embodiments, the control circuit (e.g., the control circuit 1120 of FIG. 12) may be configured to: transmit a signal outward by the second transmission method using the second coil and the third coil; and transmit a signal outward by the third transmission method only using the third coil. According to various embodiments, the control circuit (e.g., the control circuit 1120 of FIG. 12) may include a switch (the switch 1124 of FIG. 12), and the switch may be configured to selectively connect the second coil and the third coil when transmitting the signal by the second transmission method and when transmitting the signal by the third transmission method.

According to various embodiments, the switch (e.g., the switch 1124 of FIG. 12) may be configured to: electrically separate the second coil and the third coil when transmitting the signal by the second transmission method; and electrically connect the second coil and the third coil when transmitting the signal by the third transmission method.

According to various embodiments, a distance between the second portion and the third portion of the first coil may be greater than a distance between the second portion and the second coil.

According to various embodiments, a coil, which is included in an electronic device (e.g., the electronic device 101 of FIG. 1, the electronic device 201 of FIG. 2, the electronic device 300 of FIG. 3, or the electronic device 400 of FIG. 4), includes: a board; a first coil (e.g., the first coil 510 of FIG. 5A) including first, second, and third portions disposed on the board; a second coil (e.g., the second coil 520 of FIG. 5A) disposed between the first and second portions of the first coil; and a third coil (e.g., the third coil 530 of FIG. 5A) surrounding at least a part of the third portion of the first coil. The second portion of the first coil may be disposed between the third portion and the second coil.

According to various embodiments, the first, second, and third portions of the first coil (e.g., the first coil 510 of FIG. 5A) may include an NFC coil, the second coil (e.g., the second coil 520 of FIG. 5A) may include a wireless charging coil, and the third coil may include an MST coil.

According to various embodiments, the board may include first and second layers. The third portion of the first coil, a first portion of the second coil, and a first portion of the third coil may be disposed on the first layer, and the first and second portions of the first coil, a second portion of the second coil, and a second portion of the third coil may be disposed on the second layer.

According to various embodiments, the coil may further include a first connection wire configured to electrically connect the first portion and the second portion of the first coil, and a second connection wire configured to electrically connect the second portion and the third portion of the first coil.

According to various embodiments, the first connection wire may be electrically connected to at least one of the first portion and the second portion via a first via hole, and the second connection wire may be electrically connected to at least one of the second portion and the third portion via a second via hole. According to various embodiments, the first connection wire may extend from an inner side of a loop formed by at least one turn of the second coil to an outer side of the loop, and the second connection wire may extend from an inner side of a loop formed by the second portion of the first coil to an outer side of the loop.

According to various embodiments, a distance between the second portion and the third portion of the first coil may be greater than a distance between the second portion and the second coil.

According to various embodiments, the second portion of the first coil may include a shielding coil.

According to various embodiments, an electronic device (e.g., the electronic device 101 of FIG. 1, the electronic device 201 of FIG. 2, the electronic device 300 of FIG. 3 and the electronic device 400 of FIG. 4) may include a housing (e.g., the housing 3001 in FIG. 3) including a first face facing a first direction and a second face facing a second direction different from the first direction; and a Flexible Printed Circuit Board (FPCB) (e.g., the Flexible Printed Circuit Board 7000 of FIG. 16) disposed between the first and second faces. The flexible printed circuit board may include a first coil (e.g., the first coil 7010 of FIG. 16) including at least one turn, and a second coil (e.g., the second coil 7020 of FIG. 16) that includes at least one turn. At least a portion of the second coil may surround a first portion of the first coil, a second portion of the first coil may surround at least a portion of the second coil, and a third portion of the first coil may surround the second portion. The control circuit (e.g., the control circuit 1120 of FIG. 12) may configured to: transmit a signal outward by a first transmission method using the first coil; and transmit a signal outward by a second transmission method using the second coil.

According to various embodiments, the first coil may include an NFC coil, and the second coil may include a wireless charging coil.

While the present disclosure has been illustrated and described with reference to various example embodiments thereof, it will be understood by those skilled in the art that the present disclosure is not limited to these embodiments, and various changes in form and details may be made therein without departing from the spirit and scope of the present disclosure as defined by the appended claims.

What is claimed is:

1. An electronic device comprising:
a housing including a first face facing a first direction and a second face facing a second direction different from the first direction; and
a flexible printed circuit board and a control circuit disposed between the first and second faces,
wherein the flexible printed circuit board includes:
a first coil comprising a first portion, a second portion, and a third portion, wherein the first, second, and third portions of the first coil each include at least one turn of the first coil,
a second coil including at least one turn, and
a third coil including at least one turn,
wherein at least a part of the second coil surrounds the first portion of the first coil,
the second portion of the first coil surrounds at least a part of the second coil,
the third portion of the first coil surrounds the second portion of the first coil, and
at least a part of the third coil is disposed between at least a part of the second portion of the first coil and at least a part of the third portion of the first coil, and
wherein the control circuit is configured to: transmit a signal outward by a first transmission technique using the first coil; transmit a signal outward by a second transmission technique using the second coil; and transmit a signal outward by a third transmission technique using the third coil.

2. The electronic device of claim 1, wherein the first transmission technique supports transmission of an NFC signal, the second transmission technique supports transmission of a wireless charging signal, and the third transmission technique supports transmission of an MST magnetic signal corresponding to a magnetic settlement card.

3. The electronic device of claim 1, further comprising:
a first connection wire configured to electrically connect the first portion of the first coil and the second portion of the first coil; and
a second connection wire configured to electrically connect the second portion of the first coil and the third portion of the first coil.

4. The electronic device of claim 3, wherein the flexible printed circuit board includes at least two layers, wherein the first connection wire is disposed on a first layer of the flexible printed circuit board, at least one of the first portion of the first coil and the second portion of the first coil are disposed on a second layer of the flexible printed circuit board, and the first connection wire is electrically connected to at least one of the first portion of the first coil and the second portion of the first coil via a via hole.

5. The electronic device of claim 3, wherein the first connection wire extends from an inner side of a loop defined by at least one turn of the second coil to an outer side of the loop.

6. The electronic device of claim 3, wherein the flexible printed circuit board includes at least two layers, and
wherein the second connection wire is disposed on a first layer of the flexible printed circuit board, at least one of the second portion of the first coil and the third portion of the first coil is disposed on a second layer of the flexible printed circuit board, and the second connection wire is electrically connected to at least one of the second portion of the first coil and the third portion of the first coil via a via hole.

7. The electronic device of claim 3, wherein the second connection wire extends from an inner side of a loop defined by the second portion of the first coil to an outer side of the loop.

8. The electronic device of claim 1, wherein the control circuit is configured to: transmit a signal outward by the second transmission technique using the second coil and the third coil; and transmit a signal outward by the third transmission technique using the third coil.

9. The electronic device of claim 1, wherein the control circuit includes a switch configured to selectively connect the second coil and the third coil when transmitting the signal by the second transmission technique and when transmitting the signal by the third transmission technique.

10. The electronic device of claim 9, wherein the switch is configured to: electrically separate the second coil and the third coil when transmitting the signal by the second transmission technique; and electrically connect the second coil and the third coil when transmitting the signal by the third transmission technique.

11. The electronic device of claim 1, wherein a distance between the second portion of the first coil and the third portion of the first coil is greater than a distance between the second portion of the first coil and the second coil.

* * * * *